(12) United States Patent
Vicentini et al.

(10) Patent No.: US 6,693,384 B1
(45) Date of Patent: Feb. 17, 2004

(54) INTERCONNECT STRUCTURE FOR ELECTRONIC DEVICES

(75) Inventors: Frederic J. Vicentini, Redwood City, CA (US); Thomas L. Credelle, Morgan Hill, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 10/061,432

(22) Filed: Feb. 1, 2002

(51) Int. Cl.[7] .................. G01G 3/10; H01L 23/495
(52) U.S. Cl. ..................... 315/169.1; 257/668
(58) Field of Search ............ 315/169.1, 169.2, 315/169.3, 169.4; 257/59, 72, 734, 774, 776, 211, 758, 668; G01G 3/10; H01L 23/495

(56) References Cited

U.S. PATENT DOCUMENTS

| | | | |
|---|---|---|---|
| 4,979,554 A | * 12/1990 | Nelson | 160/135 |
| 5,028,983 A | * 7/1991 | Bickford et al. | 357/69 |
| 5,330,365 A | * 7/1994 | Leeson | 439/77 |
| 5,591,990 A | * 1/1997 | Misawa et al. | 257/72 |
| 5,844,783 A | * 12/1998 | Kojima | 361/777 |
| 6,187,610 B1 | * 2/2001 | Armezzani et al. | 438/106 |
| 6,417,025 B1 | * 7/2002 | Gengel | 438/107 |
| 2002/0050958 A1 | * 5/2002 | Matthies et al. | 345/55 |

OTHER PUBLICATIONS

Chiang, A., "Application of Fluidic Self Assembly™ Technology to Flat Panel Displays," IDW '00, Nov. 30, 200, Invited Talk, Paper AMD3–1, pp. 195–198.

* cited by examiner

*Primary Examiner*—Don Wong
*Assistant Examiner*—Trinh Vo Dinh
(74) *Attorney, Agent, or Firm*—Blakely, Sokoloff, Taylor & Zafman LLP

(57) ABSTRACT

A display device and method of fabricating the same. The display device comprises a first array of transparent conductors. The first array of transparent conductors has a first pitch defined by a first distance between adjacent transparent conductors of the first array of transparent conductors. The display device further comprises a second array of conductors disposed on a plurality of integrated circuit (IC) devices coupled to a carrier, which couples to the display device. The second array of conductors has a second pitch defined by a second distance between adjacent conductors of the second array of conductors. The first pitch and the second pitch are substantially similar. The first array of transparent conductors interconnects the second array of conductors.

10 Claims, 18 Drawing Sheets

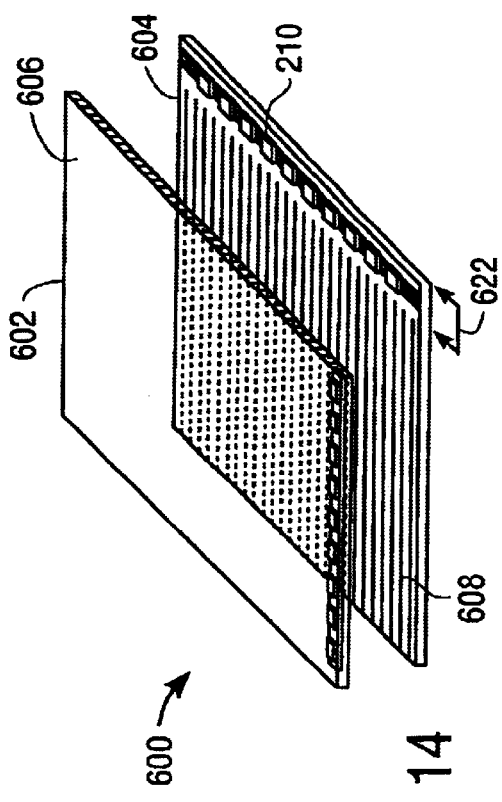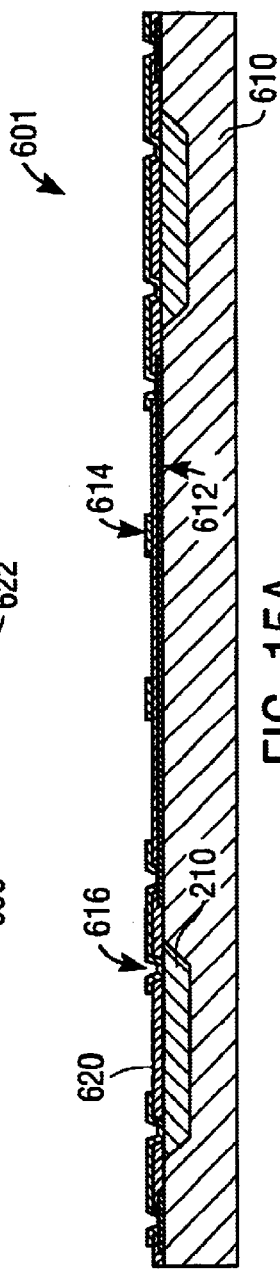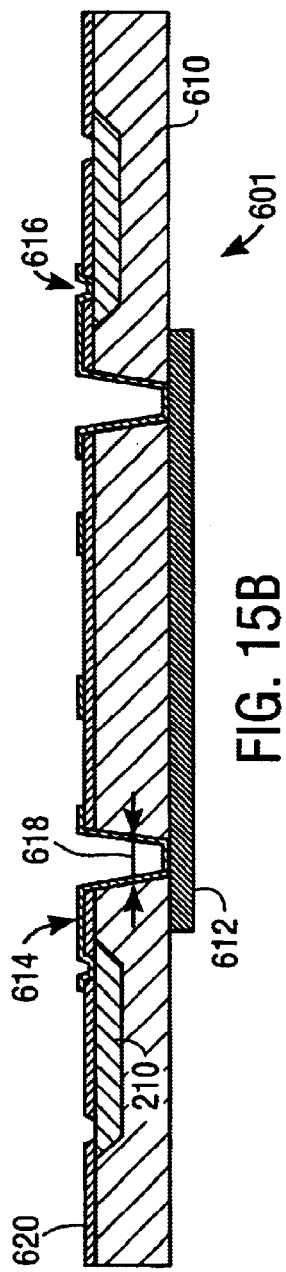

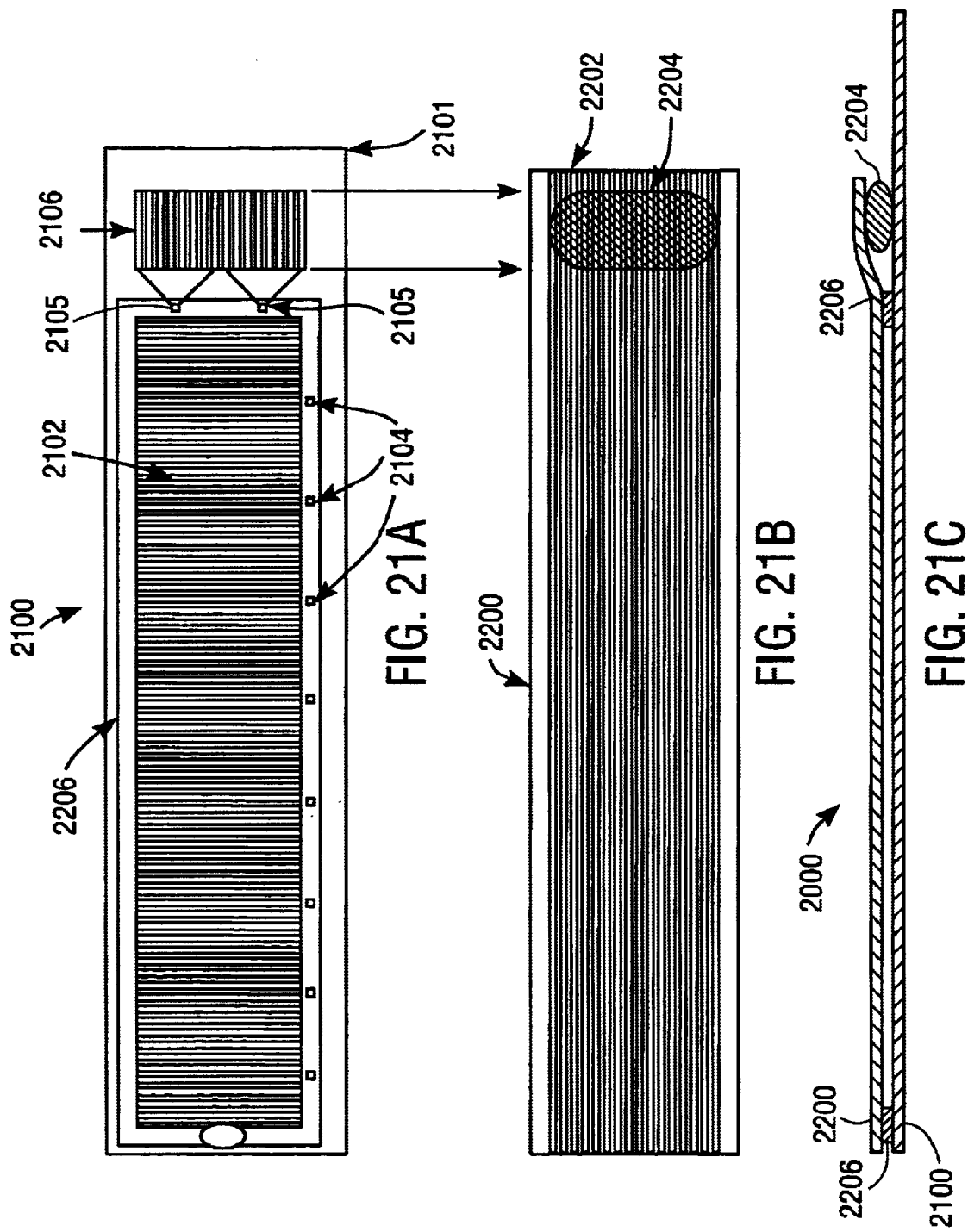

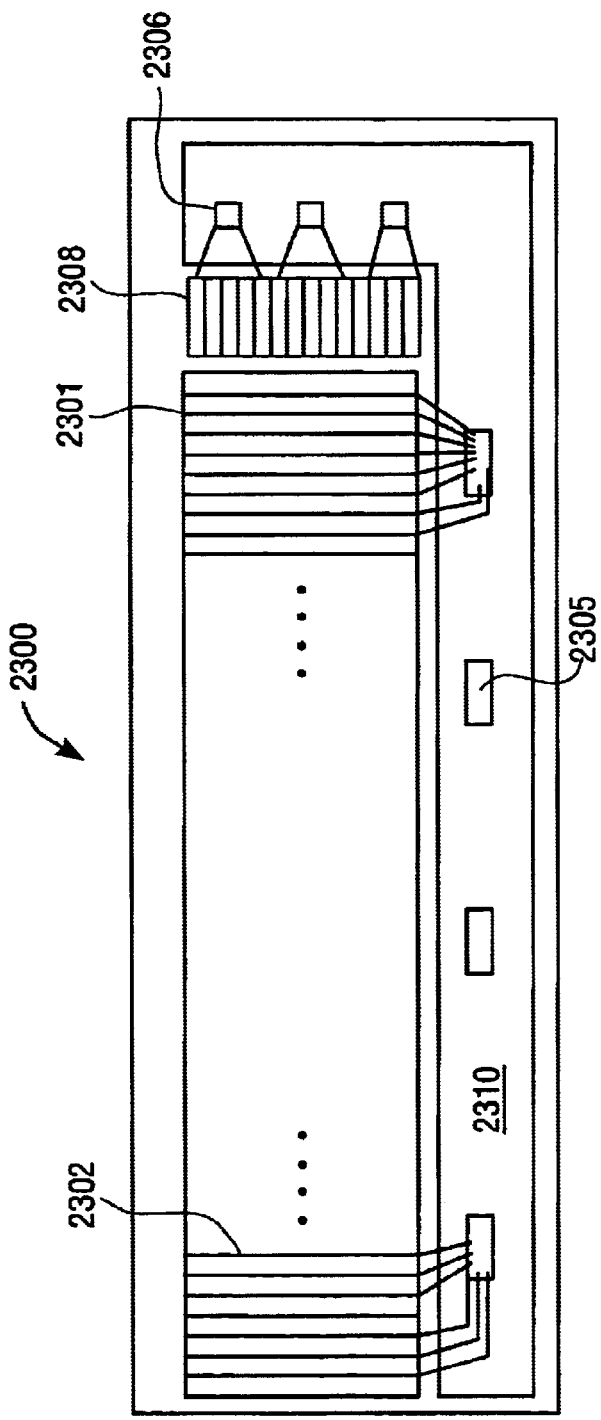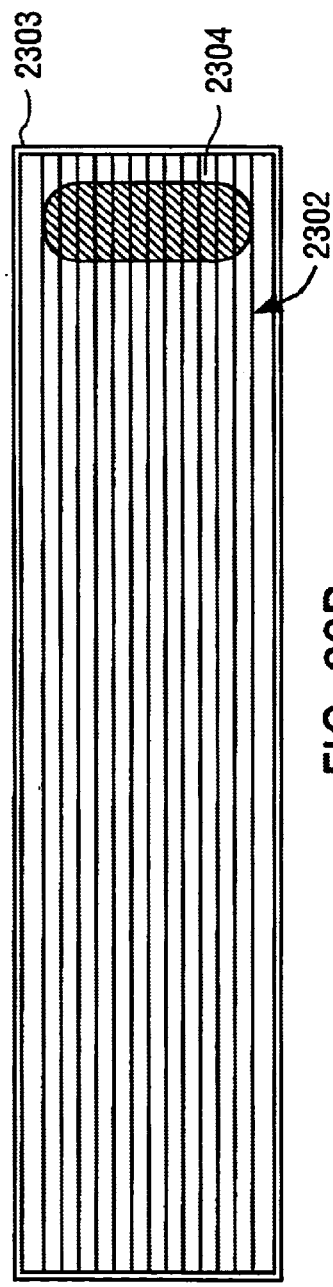
FIG. 22A
FIG. 22B

INTERCONNECT STRUCTURE FOR ELECTRONIC DEVICES

FIELD OF THE INVENTION

The present invention relates to interconnect structures for electronic devices, and more particularly, in certain embodiments, to display devices such as flat panel displays.

BACKGROUND OF THE INVENTION

While the present invention has many aspects and embodiments, this section will focus on those aspects which relate to display devices. While there are a large number of various different types of display devices, one very common display device utilizes pixel electrodes to control a display medium such as a liquid crystal display (LCD) layer in order to create an image. These pixel electrodes may control other types of display media such as electrophoretic display media, organic light emitting diodes (OLED), or a polymer light emitting diode (PLED). Typically, a pixel electrode works by creating locally an electric field relative to another electrode. A display medium is sandwiched between the two electrodes and reacts to this electric field. Well known examples of such types of displays are the active matrix liquid crystal displays used in modern laptop computers and passive matrix display used in modem PDA computers or cellular phones.

FIG. 1 illustrates an example of a backplane for an active matrix display in the prior art. As is well known, a plurality of pixel electrodes, such as pixel electrode 9C, are arranged in an array of rows and columns. Each row of pixel electrodes is controlled by a row electrode such as row electrodes 2, 3, and 4. At least one transistor device is coupled to each pixel electrode in order to control the updating of new data to the pixel electrode in order to change the image being displayed. For example, as shown in FIG. 1, the field effect transistor (FET) 9A couples the pixel electrode 9C to the data line 1 on column 5 when row 2 receives a high voltage signal (e.g. 5 volts), causing the data value provided on column 5 to be stored onto the capacitor 9B which in turn causes the storage of a voltage value on the pixel electrode 9C. As is known in the art, each row receives a plurality of data in parallel substantially simultaneously as each row's signal line goes high, causing the gate electrode to allow the transistor device to conduct, thereby causing the data from the associated column to be written to the pixel electrode through the capacitor. It will be appreciated in certain embodiments that the capacitor is merely optional and the capacitance of the FET device itself will be sufficient to store the charge for the pixel electrode to thereby maintain the pixel electrode at a certain voltage. Thus the display is updated one row at a time where each row receives in parallel a plurality of data from the parallel columns, such as columns 5, 6, 7 and column 8 as shown in FIG. 1. It will be appreciated that each pixel cell includes a display driver such as display drivers 9, 10, and 11 which control associated pixel electrodes in the display shown in FIG. 1.

FIG. 2 illustrates an example of a conventional passive matrix display. A passive matrix display is similar to the active matrix display except that each row and column is controlled by one driver attached to that row or column. A conventional passive matrix 100 is a liquid crystal display passive matrix comprising a number of layers. The display comprises a top substrate 102 and a bottom substrate 103. The top substrate 102 and the bottom substrate 103 can be made out of glass. Each of the top substrate 102 and the bottom substrate 103 is coated with a plurality of transparent conductive lines arranged in an array of rows 104 or column 106. The rows 104 and the columns 106 are made out of a highly transparent material, typically, indium tin oxide (ITO) to prevent the conductors from interfering with the image quality. As well understood, the rows and columns of the transparent conductors operate as a grid of row and column of pixel electrodes, which passes the current needed to activate the screen elements and control the pixels on the display screen. On top of each of the transparent conductors, an alignment layer 108 may be deposited. The alignment layer is typically a polymer material that has a series of parallel grooves running across it to help align the liquid crystal molecules in the appropriate direction, and to provide a base on which the molecules are attached. Spacer beads 110 may also be disposed between the two alignment layers 108. The spacer beads 110 help maintain a uniform distance between the two substrates 102 and 103 when they are placed together.

The edges are then sealed with an epoxy, but with a gap left in one corner. The corner allows liquid-crystal materials 111 to be injected between the sheets (in a vacuum) before the plates are sealed completely. Next, polarizing layers 112, which are linear light filters, are applied to the outer-most surfaces of each of the substrate 102 and 103. The polarizing layer 112 are arranged to match the orientation of the alignment layers 108. A backlight (not shown) can also be added, typically in the form of cold-cathode fluorescent tubes mounted along the top and bottom edges of the panel, the light from these being distributed across the panel using a plastic light guide or prism.

FIG. 3 illustrates the passive display 100 driven by a row driver 114 and a column driver 116. This figure shows that an image 120 is formed when the row driver 114 and the column drive 117 passes signals along the corresponding row 106 and column 104 of the display 100. The column driver 116 and the row driver 114 are typically integrated circuits containing input/output circuit elements that are customarily fabricated upon semiconductor (silicon) chips to drive the display 100. The integrated circuits typically include the transistor, resistor and capacitor elements required to perform the circuit function (e.g., diving the display). The column driver 116 and the row driver 114 can be integrated into the substrate of the display, e.g, chip-on-glass (COG), or fabricated on a package that is attached to the display, e.g., chip-on-flex (COF) or tape automated bonded (TAB).

While the foregoing display architecture works well generally for many types of applications, it is well known that manufacturing these displays is expensive due to poor yields especially when the size of the display is large. It is also well known that to save cost, the silicon used to make the display drivers (e.g., drivers for a passive matrix display), are fabricated to be as small as possible. One problem with this cost saving approach is that the driver interconnections to the display become extremely complex and unreliable which, further hinders high yield.

FIG. 4 illustrates that a substrate of the display 100 has a pitch P3 wherein the pitch is defined as the distance between two adjacent lines of display conductors (e.g., the distance between conductor row 104 and conductor row 105). Usually, lines of conductor have a certain width, then the pitch is defined by the distance between the middle of one line to the middle of the other line. A carrier 120 including the driver chip 114 is shown to connect to the display 100. The driver 114 is fabricated from a small piece of silicon to minimize the cost of the display. Because of the size reduction, the IC driver 114 has a pad pitch P1 that is substantially smaller than the pitch P3, (a pad pitch on an IC is defined as the distance between the middle of a pad and the middle of an adjacent pad). Pitch P2, which is the interconnection pitch directly at the edge of the carrier 120 to the display, may be as large as the pitch P3. However, the complex interconnection leads from the driver 114 to the carrier 120 still remains the problem. This leads to poor yield problems. For example, though not shown in FIG. 4, in actuality, the routing is much more complex, especially when the display's arrays of conductors comprise many more conductors. For example, a typical display has a line pitch of about 80–400 μm and the driver has a pad pitch of about 40–60 μm. Beside the IC interconnection poor yield, this approach necessitates complex and long routing lines, leading to signal integrity damages for demanding high voltage or high current optical media. These problems escalate for the case of high resolution displays where the pitch of the arrays of conductors is much smaller.

With recent demands for higher resolution displays, the pitch of these displays are smaller since more rows and columns of conductors are employed to enhance the resolution. The increase in density of the conductors in the display magnifies the problem of complex interconnection from the driver to the display making the fabrication of the display complicated and costly.

FIG. 5 illustrates that to minimize the drastic difference in the pitch between the display and the driver, two drivers have been used to drive a display panel. The display 100 connects to a carrier 120 having a driver 114 on one side and to a carrier 122 having a driver 115 on the other side. This is typically referred to as odd/even double-sided connection. The display has a pitch P3 which is defined by the distance between two adjacent rows of conductors (e.g., the distance between conductor row 104 and conductor row 105). The driver 114 of FIG. 5 has a pitch P1 which is still smaller than P3 but is about two times larger than the driver 114 illustrated in FIG. 4 above. The pitch of the connection along the carrier 120 and 122 may be larger than the pitch of the display 100. This may minimize the complex interconnection problem seen in the example of FIG. 4 but the silicon material requirement or surface has doubled. Moreover, the double-side interconnection also reduces the compactness for the display making it difficult to fabricate small display devices (useful for portable application: cell phone, laptop . . . ).

In all of the examples discussed above, most of the time the IC drivers only interface to the display 100 only from one side of the chip. Because not all sides of the chips are utilized to interconnect with the display lines, this results in wasting costly material such as silicon thus driving up the cost of fabricating the display.

It is thus desirable and advantageous to make a more simple, cost effective, and reliable interconnection structure for used with electronic devices such as flat panel displays.

SUMMARY OF THE INVENTION

Various different aspects and embodiments of different inventions are described here. These different aspects include different configurations of display devices as well as methods relating to the fabrication of the display devices.

According to one aspect of the present invention, a display device comprises a first array of transparent conductors. The first array of transparent conductors has a first pitch defined by a first distance between adjacent transparent conductors of the first array of transparent conductors. The display device further comprises a second array of conductors disposed on a plurality of integrated circuit (IC) devices which are coupled to a carrier, which couples to the display device. The second array of conductors has a second pitch defined by a second distance between adjacent conductors of the second array of conductors. The first pitch and the second pitch are substantially similar. The first array of transparent conductors interconnects the second array of conductors.

According to another aspect of the invention, a display device comprises a top substrate having a first length and a first array of transparent conductors. The display device further comprises a bottom substrate having the first length and a second array of transparent conductors. A first carrier coupling to the top substrate and a second carrier coupling to the bottom substrate. Each of the first carrier and the second carrier has a second length, includes a plurality of IC devices, and includes carrier conducting pads to interconnect the plurality of IC devices to the transparent conductors. Each of the plurality of IC device has an array of interconnections which substantially surround a perimeter of each of the plurality of IC devices.

According to another aspect of the present invention, a display device comprises a top substrate having a first array of transparent conductors. The display device also comprises a bottom substrate having a second array of transparent conductors. A first plurality of IC devices and a second plurality of IC devices are fabricated onto one of the top substrate or the bottom substrate. A crossover contact area is extended from the top substrate or the bottom substrate which has the first plurality of IC devices fabricated therein. The crossover contact area includes a plurality of contact conductors which interconnect the second plurality of IC devices to one of the top substrate and the bottom second substrate which does not have the first plurality of IC devices and the second plurality of the IC devices fabricated therein.

According to yet another aspect of the present invention, a device for use with a display comprises a substrate. The substrate comprises a plurality of IC devices deposited therein. The substrate further comprises double-layer structure conductors which comprise a first set of conductors and a second set of conductors separated by an insulation layer. The insulation layer has a plurality of contact vias forming therethrough. A plurality of conducting pads locating on a surface of each of the plurality of the IC devices. The plurality of conducting pads interconnects with one of the first set of conductors or the second set of conductors through the first plurality of contact vias. The first set of conductors and the second set of conductors interconnect with each other through the plurality of contact vias. And, the first set of conductors and the second set of conductors interconnect with an array of transparent conductors in the display devices.

Other aspects and methods are also described herein.

BRIEF DESCRIPTION OF THE DRAWINGS

The present invention is illustrated by way of example and not limitation in the figures of the accompanying drawings in which like references indicate similar elements.

FIG. 14 illustrates an exemplary embodiment of a display according to another aspect of the present invention in which display drivers are integrated into the display panel.

FIGS. 15A and 15B illustrate cross-sectional views of exemplary embodiments of a structure of double conductive layers that can be used to drive a display made according to some aspects of the present invention.

FIGS. 21A, 21B, and 21C illustrate another exemplary embodiment of a display according to an aspect of the present invention in which both the row drivers and the column drivers are incorporated in one of the two substrates of the display.

FIGS. 22A and 22B illustrate yet another exemplary embodiment of a display according to an aspect of the present invention in which both the row drivers and the column drivers are embedded in a carrier which is coupled to one of the two substrates of the display.

DETAILED DESCRIPTION

The subject invention will be described with reference to numerous details set forth below and the accompanying drawings, which will illustrate the invention. The following description and drawings are illustrative of the invention and are not to be construed as limiting the invention. Numerous specific details are described to provide a thorough understanding of the present invention. However, in certain instances, well-known or conventional details are not described in order to not unnecessarily obscure the present invention in detail. Further, various aspects of the present invention will be described with reference to the use of aspects and embodiments of the invention in display systems. It will be appreciated that the reference to display systems is merely for purposes of illustration and are not to be construed as limiting the invention.

In the numerous exemplary embodiments below, an interconnect structure for a display is disclosed. In general, the interconnect structure includes a first array of transparent conductors. The first array of transparent conductors has a first pitch defined by a first distance between adjacent transparent conductors or more precisely, a distance between the middle of each adjacent lines of the first array of transparent conductors. A second array of conductors is disposed on a plurality of integrated circuit devices which are coupled to a carrier. The carrier is coupled to the display device. The second array of conductors has a second pitch which is defined by a second distance between adjacent conductors of the second array of conductors. In this embodiment, the first pitch and the second pitch are substantially similar.

Figure 1:
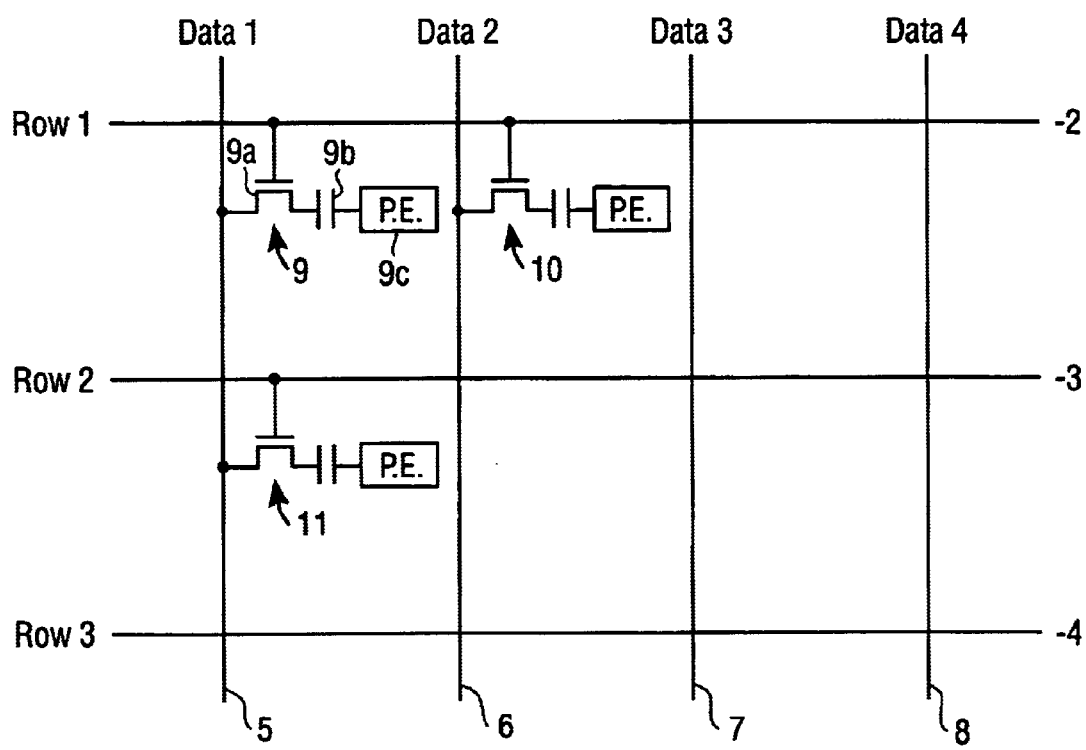
FIG. 1 illustrates an example of a prior art active-matrix display.
Figure 2:
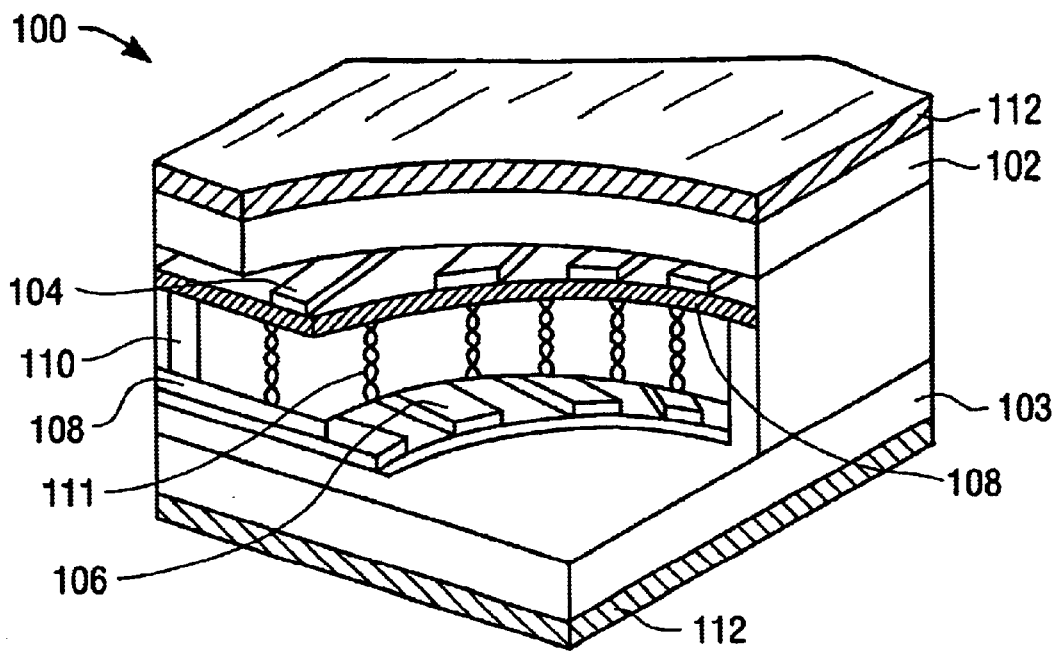
FIG. 2 illustrates an example of a prior art passive-matrix display.
Figure 3:
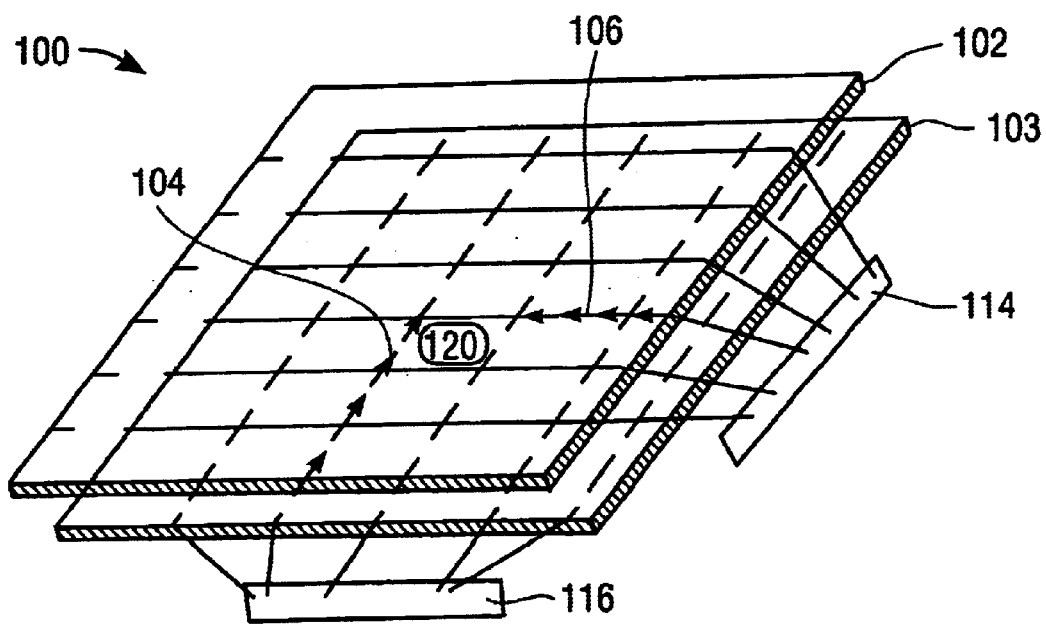
FIG. 3 illustrates an example of a prior art passive-matrix display having two substrates each having a driver (e.g., a row driver and a column driver).
Figure 4:
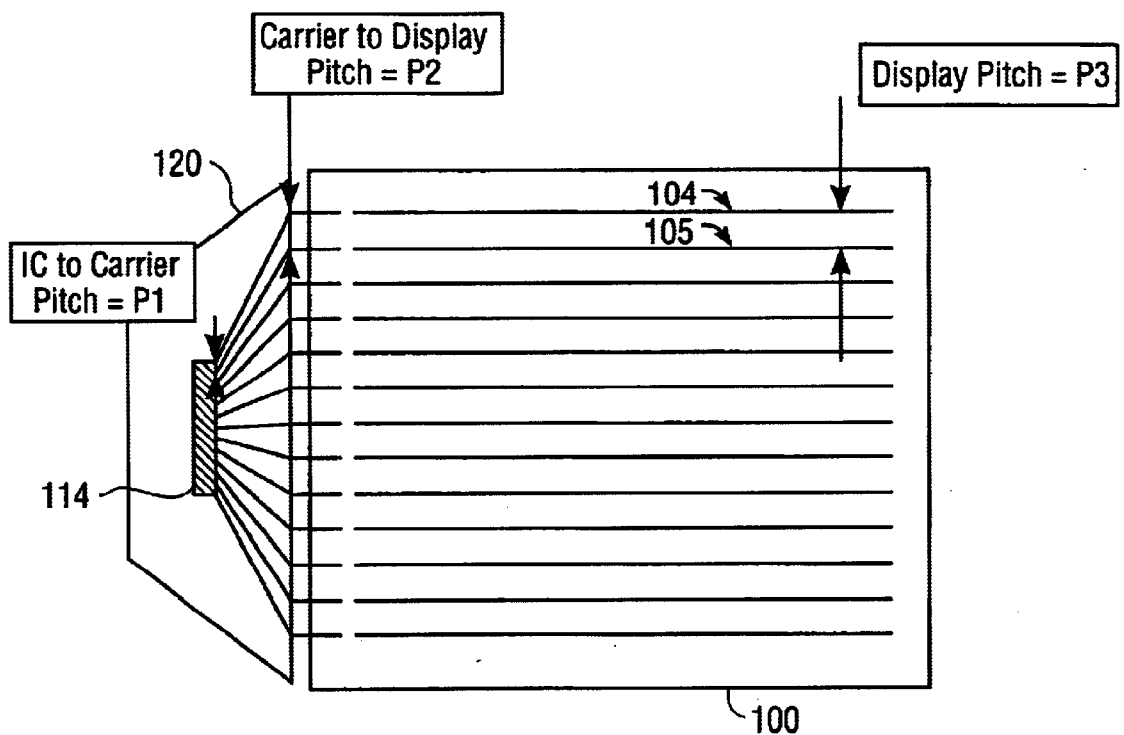
FIG. 4 illustrates a top view of an interconnection problem associated with the prior art display.
Figure 5:
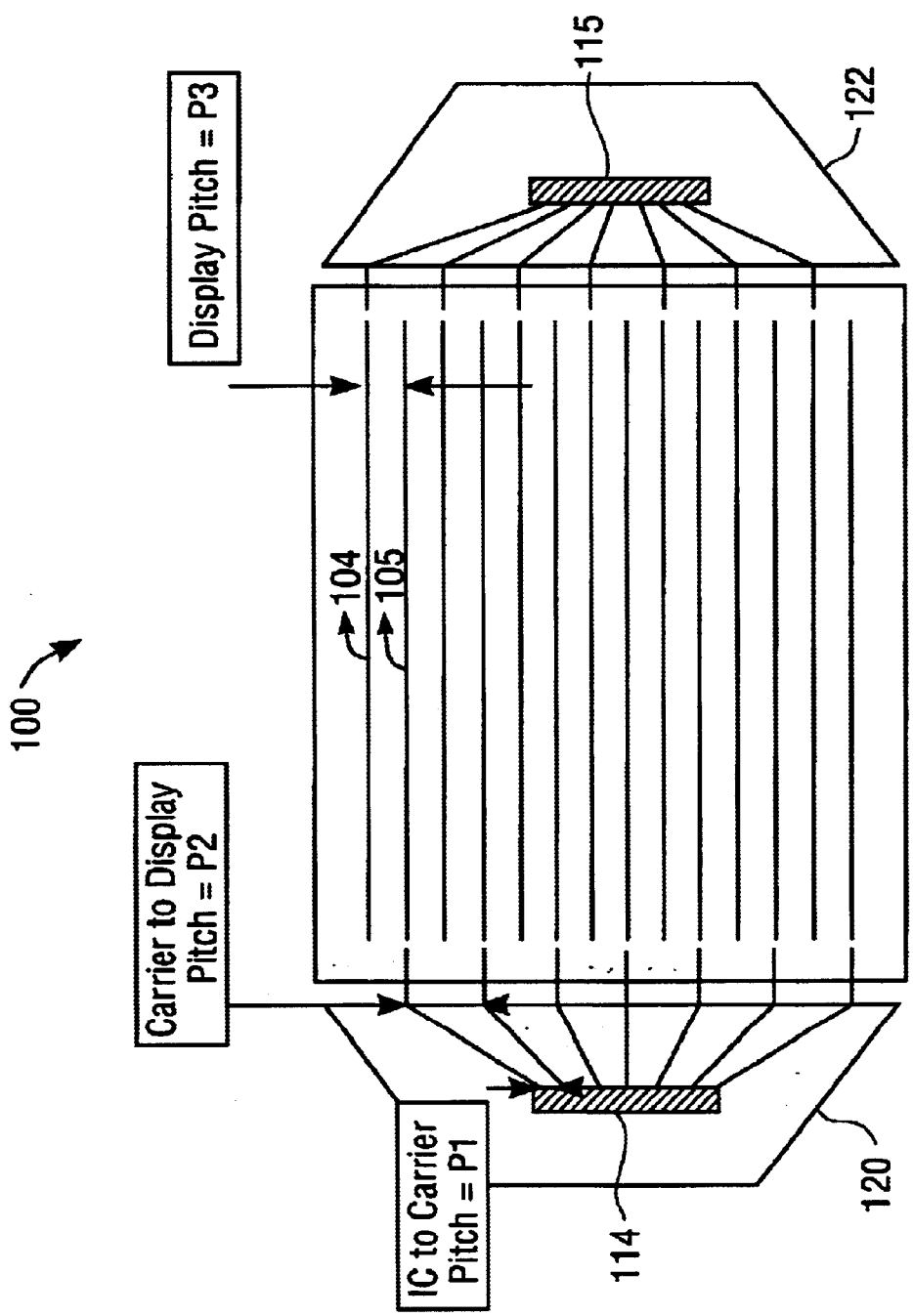
FIG. 5 illustrates yet another top view of an interconnection problem associated with the prior art display.
Figure 6:
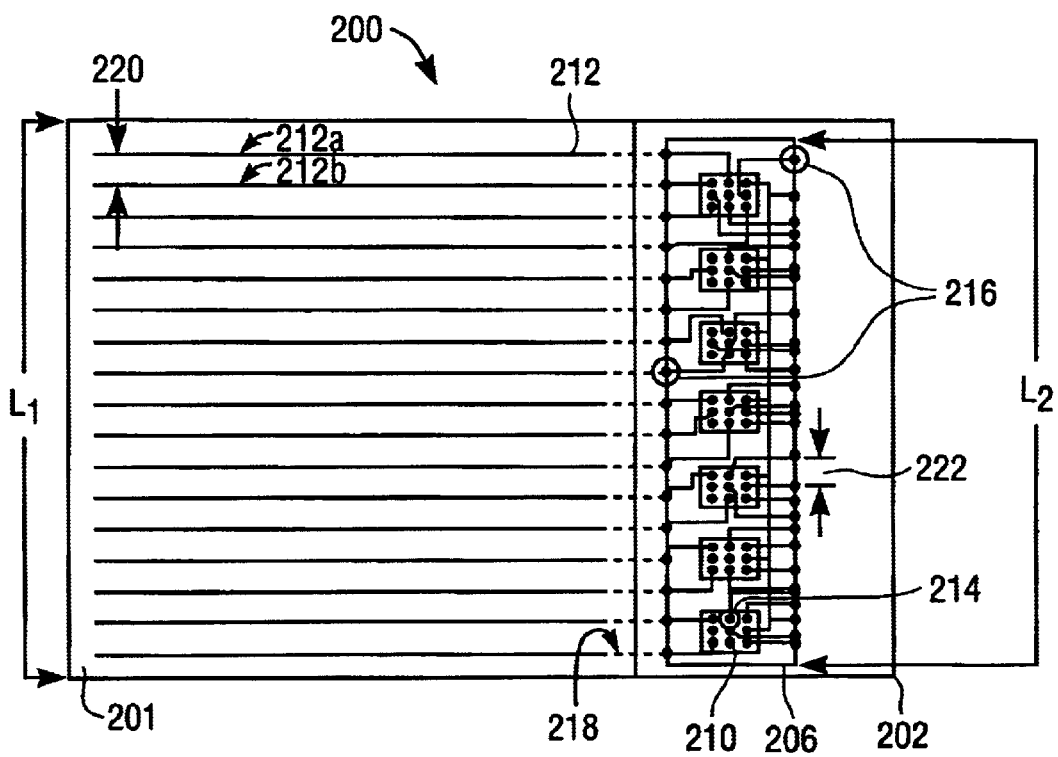
FIG. 6 illustrates an exemplary embodiment of a display according to one aspect of the present invention in which IC devices interconnect from more than one sides of each of the IC devices.

FIG. 6 illustrates an exemplary embodiment of a display 200 according to one aspect of the present invention. The display 200 can be a column and row driven display (e.g., a passive matrix display). The display 200 comprises a substrate 202 in which a display area 201 is defined. An array of transparent conductors 212 (e.g., ITO) is deposited on the substrate 202 to cover at least all of the display area 201 using conventional methods. The substrate 202 is also referred to as a display panel. The substrate 202 having the transparent conductors 212 already formed therein can also be obtained commercially from numerous suppliers. For example, from CPFilms, Canoga Park Calif. or NEOVAC, Santa Rosa Calif. FIG. 6 shows that the array of the transparent conductors 212 can be arranged in an array of rows of conductors. A carrier 206 having a plurality of integrated circuit (IC) devices 210 for driving the display 200 is coupled to the substrate 202.

The substrate 202 can be made out of transparent material such as glass or plastic or any other suitable material for making a display. In a preferred embodiment, the substrate 202 is made out of a flexible material suitable for used in a flat panel display.

Each of the plurality of the IC devices 210 comprises circuits that perform particular functions relating to driving the display 200 (see below discussion). Each of the IC devices also comprises a first plurality of connection pads 214 to connect the IC devices to the corresponding conductors in the array 212. The connection pads 214 interconnect to the array 212 through a second plurality of connection pads 216 present on the carrier 206. Each of the connection pads 216 couple to an interconnection line 218 which is coupled to one of the rows of the conductors in the array 212. In most instances, the interconnection lines 218 are the same lines as the array of conductors 212. In a preferred embodiment, the second plurality of connections pads 216 are aligned along the long edges of the carrier 206 for ease of connecting carrier comprising the IC devices to the display. In other embodiments, the second plurality of connection pads 216 is aligned along one long edge of the carrier 206. The connection pads 216 can be made out of conductive material (e.g., metals, aluminum, gold, silver, and copper, etc.). The connection pads 214 are also made out of some conductive material. The connection pads 214 are formed on the top surface of each of the IC devices 210 (see discussion in FIG. 12). The interconnection lines 218 can be a set of conductive lines (e.g., metals, aluminum, gold, silver, and copper, etc.) or can be the same ITO lines 212. A method such as photolithography can be used to form these lines 218 to connect the connection pads 216 to the appropriate conductors 212.

As shown in FIG. 6, the display 200 has a first pitch 220, which is the pitch of the display. The first pitch 220 is defined by a first distance which is the distance between (middle of) adjacent transparent conductors of the array of transparent conductors 212 (e.g., conductors 212a and 212b). The pitch 220 depends on the resolution desired for the particular display. In one example, the display 200 has a pitch of 200 $\mu$m. The carrier 206 has a second pitch 222 which is the pitch of the connection pads 216. In one example, the pitch 222 is equal to the pitch 220. In another example, the pitch 222 is substantially similar to the pitch 220. For instance, when the first pitch 220 is about 200 $\mu$m, the second pitch 222 is also about 200 $\mu$m. Alternatively, the second pitch 222 may vary from 150 $\mu$m to 250 $\mu$m which makes the second pitch 222 substantially similar to the first pitch 220.

Also as shown in FIG. 6, the display 200 has a first length L1 (the length of the interconnecting side). The carrier 206 has a second length L2. In a preferred embodiment, the first length L1 and the second length L2 are substantially similar. For example, when the first length L1 is about 20 cm, the second length L2 is also about 20 cm.

Figure 7:
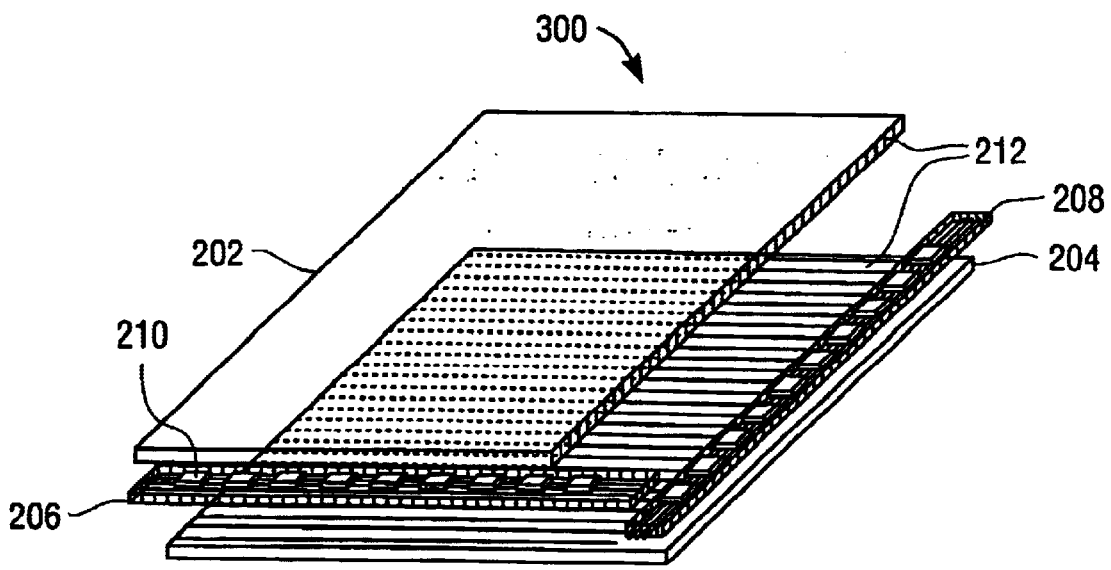
FIG. 7 illustrates an exemplary embodiment of a display according to another aspect of the present invention in which IC devices are incorporated into carriers which are coupled to display substrates of the display.

FIG. 7 illustrates another exemplary embodiment of a display 300 which similar to the display 200. The display 300 can be a flat panel display. The display 300 includes both the row and column driven layers. The display 300 comprises a top substrate 202 and a bottom substrate 204. Each of the top substrate 202 and the bottom substrate 204 is similar to the one discussed in FIG. 6. Each of the top substrate 202 and the bottom substrate 204 can also be referred as a display panel. The top substrate 202 is shown to include an array of columns of transparent conductors 212. The bottom substrate 204 includes an array of rows of transparent conductors 212. The top substrate 202 also includes a carrier 206 and the bottom substrate 204 includes a carrier 208. The carrier 206 and the carrier 208 of FIG. 7 are similar to the carrier 206 shown in FIG. 6. The display 300 has a display area which is defined by an area of the display 300 that does not have the carriers 206 and the carrier 208 coupled thereto. A display medium, for example, LCD, PLED, and OLED, is deposited between the top substrate 202 and the bottom substrate 204 over the display area according to conventional methods (not shown).

In one exemplary embodiment, the carrier 206 of FIG. 7 is coupled to the top substrate 202 through an electrically conductive adhesive material (not shown). The carrier 204 of FIG. 7 is coupled to the bottom substrate 204 also through an electrically conductive adhesive material (not shown). One example of an electrically conductive adhesive that can be used to couple the carriers to the substrates is an anisotropic conductive polymer. The anisotropic conductive polymer offers structural integrity as well as electrical interconnection for the second plurality of connection pads 216 (shown in FIG. 6) to the transparent conductors on the substrates. The anisotropic conductive polymer allows electrical current to travel uni-directionally, usually only along the Z-direction (or the thickness) of the conductive adhesive. The anisotropic conductive polymer used for this purpose can be supplied in the form of a heat-curable liquid/paste or a heat curable thermosetting or thermoplastic adhesive film otherwise known as anisotropic conductive film (ACF). The ACF is preferred for coupling the IC devices to a substrate of the present invention.

Figure 8:
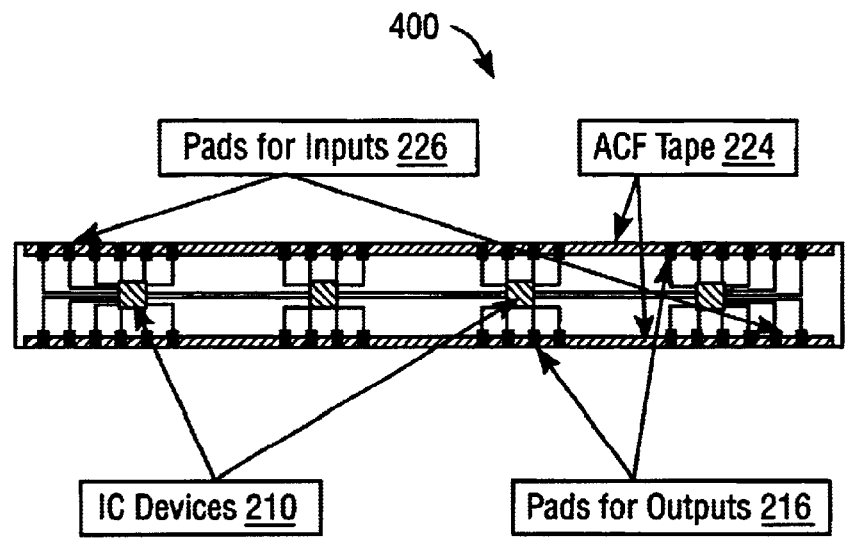
FIG. 8 illustrates a top view of a carrier that can be used in some exemplary embodiments of the present invention.

FIG. 8 illustrates a topical view of an exemplary embodiment of a carrier 400 such as the carrier 206 and 208 discussed above. The carrier 400 comprises a plurality of IC devices 210; each of the IC devices 210 includes a first plurality of connection pads such as the connections pads 214 shown in FIG. 6. The first plurality of connections pads interconnect the IC device 210 to a second plurality of connection pads that are designated as output pads 216 shown in FIG. 8, and a second plurality of connection pads that are designated as input pads 226 also shown in FIG. 8. The output pads 216 sends appropriate signals to transparent electrodes on the display such as the transparent conductors (e.g., transparent conductors in the array 212 of FIGS. 6 and 7). The input pads 226 receive data and instruction signals from an outside electronic device (for instance an IC microcontroller) to the IC devices 210 such as power, data, clock, and ground.

In one example, the IC devices 210 are designed such the interconnections made from each of the IC devices 210 substantially surround a perimeter of this IC device 210. FIG. 8 shows that each of the IC devices 210 makes interconnections from more than one of its sides. In another example, the interconnections made from each of the IC devices 210 substantially surround a perimeter of the carrier 400. In this example, the output pads 216 and the input pads 226 can be aligned along the edges of the carrier 400. FIG. 8 shows that the output pads 216 and the input pads 226 are aligned along two edges of the carrier 400. It is to be understood that the alignment of the output pads 216 and the input pads 226 is not limited to these two edges of the carrier 400. Also, the alignment of the output pads 216 and the input pads 226 may only occupy one edge of the carrier 400. Additionally, any combinations of long and short edges locations are possible for input and output pads.

An ACF tape 224 is placed along the edges of the carrier 400 over the areas where the connection pads 216 and 226 are located using conventional methods of applying an ACF tape. Pressures may be used to facilitate the placing of the ACF tape 224 over these areas. Alternatively, the ACF tape 224 can be applied only to output pads 216, then the input pads are connected directly to the outside electronic device (on a printed circuit board for instance) by traditional interconnecting methods: solder, silver-epoxy, ACF, heat-seal, etc.

Figure 9:
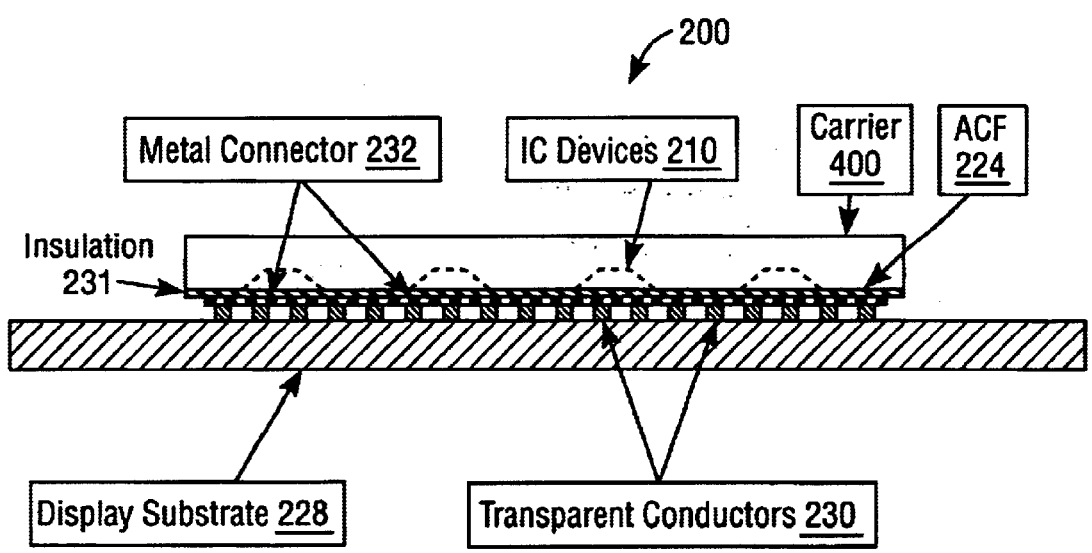
FIG. 9 illustrates a cross-sectional view of a carrier that can be used in some exemplary embodiments of the present invention.

FIG. 9 illustrates a cross-sectional view of a display 200 having the carrier 400 coupling to a display substrate 228. The display substrate 228 can be the top substrate 202 or bottom substrate 204 shown in FIG. 7. The substrate 228 includes an array of transparent conductors 230 which may be a row or column of conductors. The substrate 228 is coupled to the carrier 400 having the plurality of IC devices 210 deposited therein. Similar to discussed above, each of the IC devices 210 has connection pads (not shown) and the carrier has output pads 216 and input pads 226 (not shown). These pads facilitate interconnections from the IC devices to the transparent conductors 230. The ACF tape 224 on the carrier 400 couples to the display substrate 228 such that it is in direct contact with the transparent conductors 230 on the substrate 228.

In another embodiment, to prevent shorting to the IC devices, an insulation layer 231 is coated over the entire surface of the carrier 400 having the IC devices 210 embedded therein. Contact vias are formed in the insulation layer over those areas where the connection pads (not shown) on the IC devices 210 exist. In one example, the contact vias are only formed over the areas of those connection pads that electrical interconnections are necessary. Thus, the contact vias are formed where the interconnections will be made to the IC devices 210. A layer of metal connector 232 is deposited over the insulation layer. The metal connector 232 interconnects the IC devices 210 to the second connection pads (not shown) along the edges of the carrier 400. In one example, the metal connector 232 makes up the only metal layer in the carrier 400. As such, the carrier 400 can be referred as a single-metal structure connector. The insulation layer 231 prevents shorting to the IC devices 210 by allowing electrical interconnection only through the vias; other places on the IC devices not dedicated to connecting to outside of the IC devices are not affected by the interconnection.

Figure 10A:
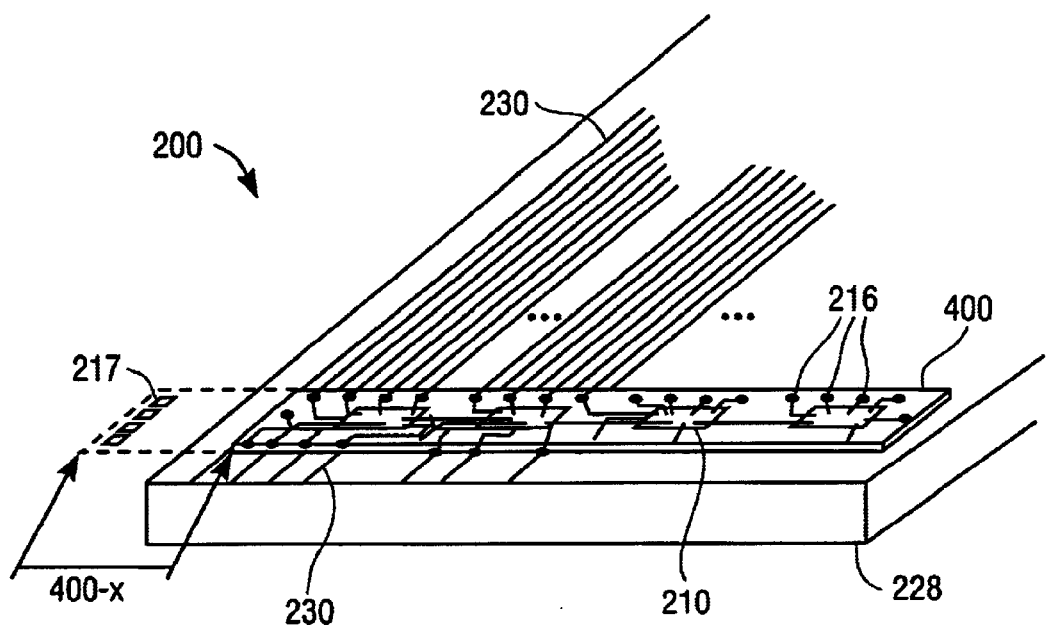
FIG. 10A illustrates a three-dimensional view of a carrier that can be used in some exemplary embodiments of the present invention which includes IC devices making interconnections from all sides of each of the IC devices and the carrier facilitating interconnections from more than one side of the carrier.

FIG. 10A illustrates a three-dimensional view of another exemplary display 200 of the present invention. In this embodiment, the carrier 400 discussed above is attached to the display substrate 228. This figure shows that each of the IC devices 210 in the carrier 400 has interconnection made from more than one of its sides. Each of the IC devices 210 has a first plurality of connection pads (not shown) placed on the surface of the IC device 210 in a way interconnections made from the IC device 210 can be made from more than one sides as shown in this figure. The first plural connection pads further interconnect to a second plurality of second connection pads 216 through conductive lines. In one example, the second plurality of connection pads 216 is placed along the edges of the carrier 400. The second plurality of connection pads 216 are placed along at least two of the four edges of the carrier 400. In another example, the second plurality of connection pads 216 are placed along only one edge of the carrier 400 as illustrated in FIG. 10B.

Figure 10B:
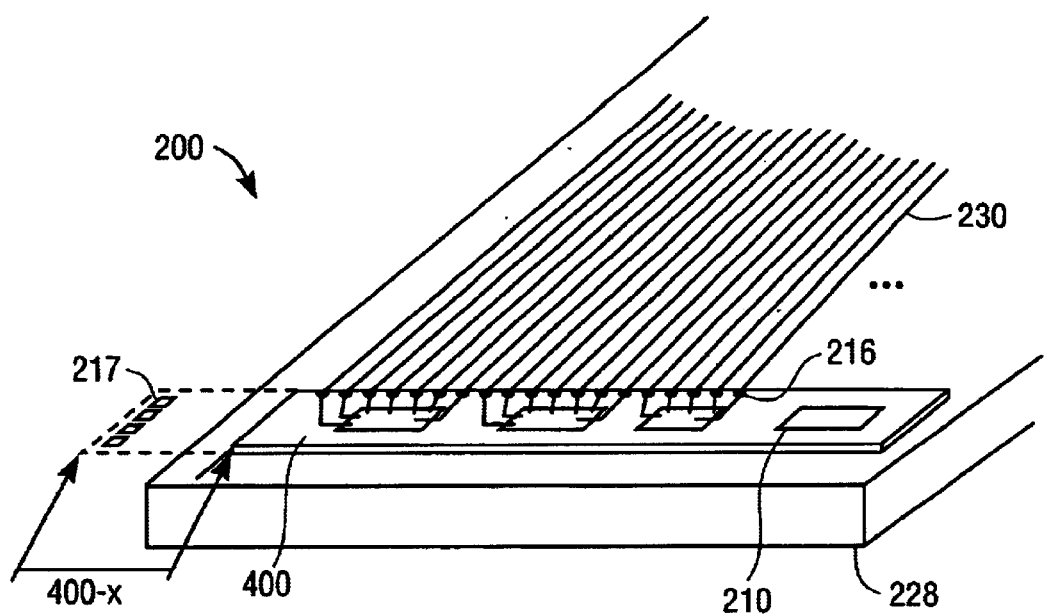
FIG. 10B illustrates a three-dimensional view of a carrier similar to FIG. 10A except that the carrier facilitates interconnections from only one side of the carrier.

In another embodiment, the carrier 400 includes an extension 400-x (see FIGS. 10A and 10B). The extension 400-x includes a plurality of input pads 217 which interconnects the carrier 400 to outside electronics.

FIGS. 10A and 10B show that the carrier 400 is coupled to the display substrate 228. In one example, the carrier 400 is coupled to the display substrate 228 using the ACF tape shown discussed above. The ACF enables both mechanical adhesion and electrical contacts between the carrier 400 and the display substrate 228. When the carrier 400 is attached to the display substrate 228 the second plurality of connection pads 216 couple to the array of transparent conductors 230 as shown in FIG. 10A. In one embodiment, the second plurality of connection pads 216 interconnects to the transparent conductors 230 from at least one of the long edge of the carrier 400 as shown in FIG. 10B. Interconnections from more than one side of the IC devices 210 as well as more than one edge of the carrier is one reason that the carrier 400 has a pitch that is substantially similarly to the pitch of the display substrate 228. In another embodiment, the second plurality of conductive pad 216 interconnects to the transparent conductors 230 from two long edges of the carrier 400 as shown in FIG. 10A. Although not shown, the interconnect can also be made from all sides of the carrier 400.

Figure 11:
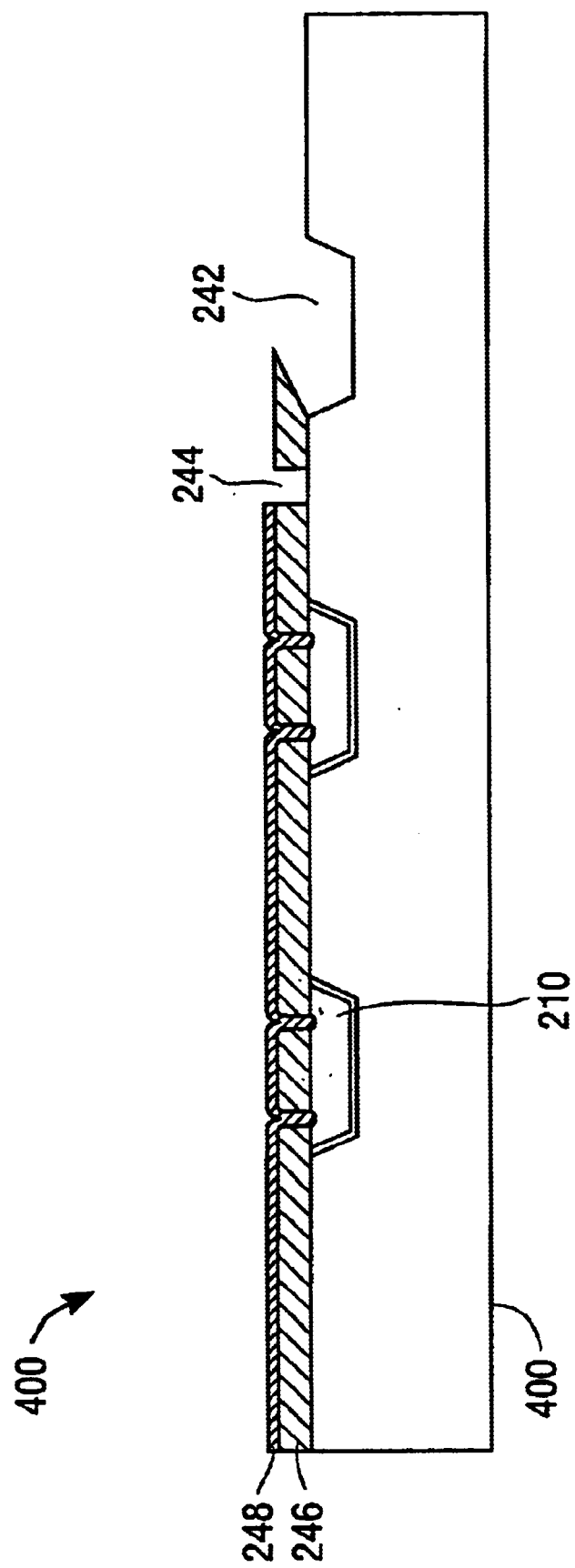
FIG. 11 illustrates an exemplary carrier that can be used in some exemplary embodiments of the present invention.

FIG. 11 illustrates an exemplary embodiment of the carrier 400 mentioned above. The carrier 400 can be made out of a flexible or rigid material which can be opaque or transparent. In a preferred embodiment, the carrier 400 is flexible. A flexible carrier 400 allows for a roll-to-toll fabrication and for easier stored in rolls after fabrication process. The carrier 400 can also be a rigid web, and if made thin enough, can be rolled up for convenient storage. The carrier 400 can be made out of a silicon wafer material, a gallium arsenide wafer, a ceramic material, plastic, glass, silica, or any suitable substrate used in semiconductor field. The carrier 400 can also be made out of a transparent material.

The carrier 400 in FIG. 11 includes a plurality of receptor sites 242, each of which is designed to couple to an IC device 210. The receptor sites 242 can be created into the carrier 400 using techniques such as stamping, embossing, injection molding, casting among others. The exemplary embodiment illustrated in this figure depicts that the receptor sites 242 are recessed regions created into the surface of the carrier 400. Having receptor sites 242 being recessed is not a limitation of the present invention. If the carrier 400 is an organic material and is an amorphous or semicrystalline polymer, the receptor sites may be embossed into the polymer material with a mold that matches the block size and pitch for the device being produced (e.g., an active matrix LCD). The receptor sites can be molded or carved into a surface, or, be designed as a raised area of a substrate. The receptor sites 242 can be recesses, bosses, protrusions, bulges, or protuberances. The receptor sites 242 thus need not be a recessed region in the carrier 400.

Continuing with FIG. 11, the carrier 400 includes a plurality of IC devices 210 deposited in the receptor sites 242. In a preferred embodiment, each of the IC devices 210 has a trapezoidal shape having a surface that includes four sides. Each of the receptor sites 242 also has a trapezoidal shape complimentary to the shape of the IC devices 210. The dimensions of the receptor sites 242 and the IC devices 210 are also similar. The trapezoidal shape of the IC devices 210 and the receptor sites 242 facilitate the correct alignment of the IC devices 210 into the carrier 400. These similarities (in shape and size) help the receptor sites 242 to easily mate with the IC devices 210.

It will be appreciated that the IC devices 210 and the receptor sites 242 may have other shapes, for instance, a cylindrical shape, pyramid shape, rectangular shape, square shape, T-shape, kidney shape, or the like. Even with other shapes, the IC devices 210 and the receptor sites 242 have similar shapes and dimensions for good mating.

The IC devices can be deposited into the receptor sites 242 using any conventional method such as pick-and-place or fluid-self-assembly (FSA) or the combination thereof. In the preferred embodiment, the IC devices 210 are deposited into the carrier 400 using FSA. Fluidic self-assembly is known in the art; see, for example, U.S. Pat. No. 5,545,291 which is hereby incorporated herein by reference. In the FSA approach, IC devices 210 can be coupled to the receptor sites 242 by being flown over the carrier 400 in a slurry solution (not shown).

Continuing with FIG. 11, the carrier 400 having IC devices 210 deposited therein also includes an insulation layer 246 deposited over the carrier 400 and the IC devices 210. The insulation layer 246 is a dielectric material that can be selected from a group of polyimide, epoxy, photo imageable solder mask or permanent photoresists. In one example, the insulation layer 246 is made out of silicon dioxide. The insulation layer 246 can function as a planarization layer that seals the IC devices 210 to the carrier 400 and creates a flat surface for the carrier 400 after the IC devices are deposited in the carrier 400. The insulation layer 246 also has a plurality of contact vias 244. The contact vias 244 are holes in the insulation layer 246 through which electrical interconnections to and from the IC devices can be established. The carrier 400 includes a metal conductor layer 248 deposited on top of the insulation layer 246. The metal conductor layer 248 facilitates the necessary electrical interconnections to and from the IC devices 210. In one example, the metal conductor layer 248 is patterned such that it matches the array of transparent conductors (e.g., array of transparent conductors 212) of the display substrate that the carrier 400 is to be coupled to.

Figure 12:
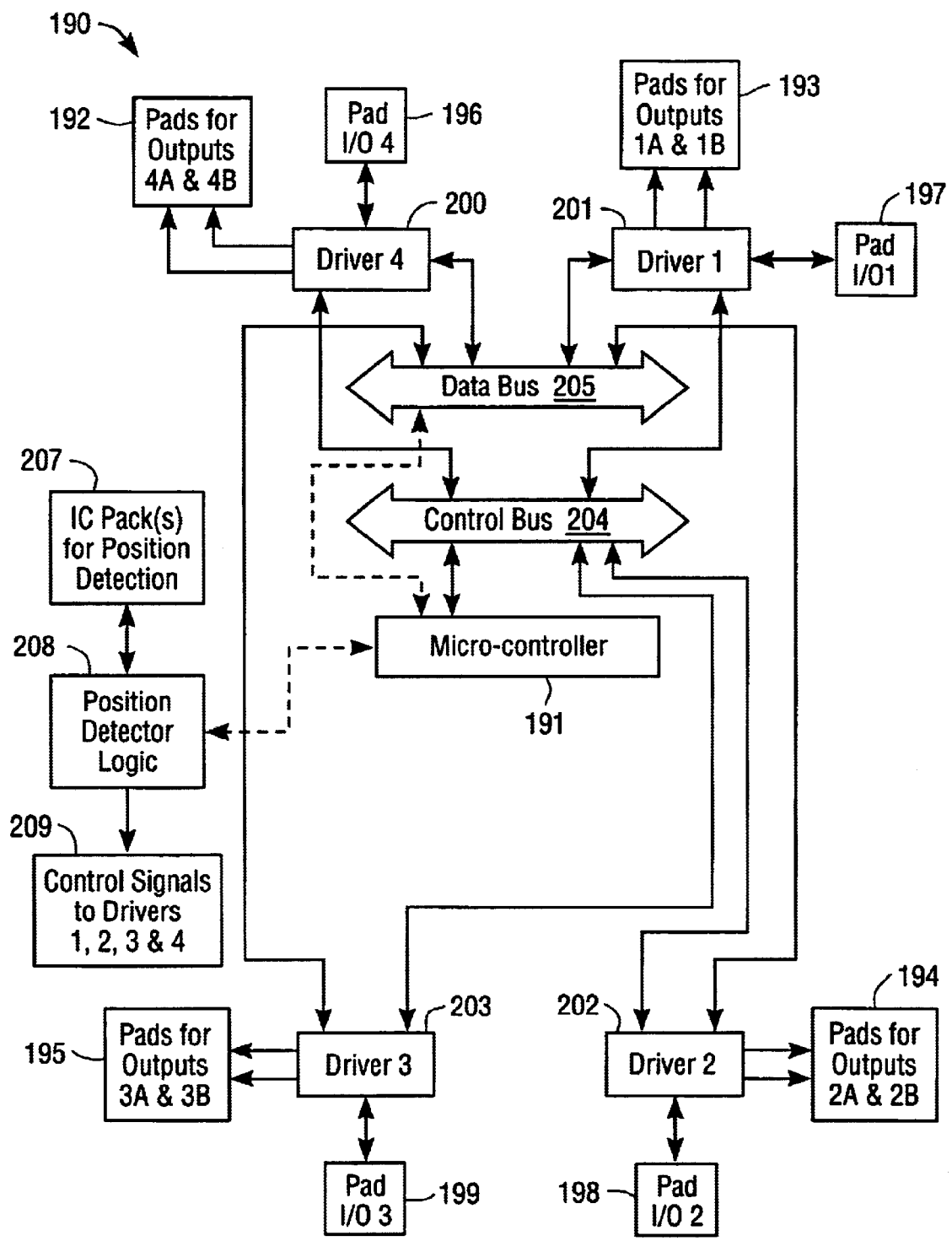
FIG. 12 illustrates an exemplary embodiment of an IC device which includes contact pads according to one aspect of the present invention.

FIG. 12 illustrates in details an IC device 210. In general, the IC device 210 includes semiconductors that are manufactured on silicon wafers. Alternatively, the IC devices can be a functional microstructure or a micro-scale electronic device such as a NanoBlock™ made by Alien Technology Inc., Morgan Hill, Calif. These functional microstructures can also be the micro structure that have been invented and disclosed in U.S. Pat. No. 6,291,896 entitled "Functionally Symmetric Integrated Circuit Die" which was filed Feb. 16, 1999 by the inventor John Stephen Smith. This application is hereby incorporated herein by reference. Methods for forming the separated integrated circuits are also described in co-pending U.S. patent application Ser. No. 09/433,605, entitled "Methods for Creating Elements of Predetermined Shape and Apparatuses for Using these Elements" which was filed on Nov. 2, 1999. This application is hereby incorporated herein by reference.

FIG. 12 shows an example of an integrated circuit 190 according to one embodiment of the present invention. This circuit 190 may be used to create the IC devices 210 shown in FIGS. 6 to 11. It may be fabricated such that internally it is asymmetric but externally its electrical interface pads are arranged so that they are externally functionally symmetric. However, according to other aspects of the invention, an embodiment of the circuit 190 does not need to be functionally symmetric externally.

The circuit 190 includes the microcontroller 191 which is optionally coupled to position detector logic 208. The microcontroller 191 is also coupled to a control bus 204 and may optionally be coupled to a data bus 205. Four drivers 200, 201, 202 and 203 are coupled to the data bus 205 and are also coupled to the control bus 204. Each driver is coupled to its respective I/O (input/output) pad on the IC device and they are also coupled to their respective pads for outputs as shown in FIG. 12. For example, driver 200 is coupled to pad I/O 4 labeled as pad 196. It will be appreciated that this is an external electrical interface pad on the integrated circuit. The driver 200 is also coupled to the pads 192 which in this case are two output pads 4A and 4B. Examples of pads 192 are connection pads 214 shown in FIG. 6.

An input/output pad can be a configurable pad which is configurable to be either an input pad or an output pad or a no-operation pad depending upon control signals provided to the particular driver. In one embodiment, these control signals may come from the control bus 204. In another embodiment, the control signals may come from the control signal logic 209 which is coupled to each of the drivers 200, 201, 202, and 203. Control signal logic 209 receives signals from the position detector logic 208 which indicates the position of the integrated circuit 190 on a receiving substrate. This position is determined by an electrical signal received by the IC pad or pads 207.

Integrated circuit 190 may be fabricated into a single block of a semiconductor substrate and then separated from the substrate and floated into an opening on a receptor substrate to create the structure shown in FIG. 11 (e.g. floated by a fluidic self-assembly process) or it may be part of a larger conventional integrated circuit which is wire-bonded to a carrier or chip package and attached to a printed circuit board. However, for the following embodiments which will be described, it will be assumed that the integrated circuit 190 is contained within a block of a semiconductor which is separated from a semiconductor substrate and then deposited into receptor sites in a receptor substrate through a fluidic self-assembly process.

The integrated circuit 190 will be deposited onto a receptor site, such as an opening in a receptor substrate (e.g. see FIG. 11). The exact position and orientation of the integrated circuit 190 cannot be controlled in this process. Accordingly, it may be required to determine the position of the integrated circuit 190 relative to the receptor substrate. This requirement may be necessary to determine a translational position on the substrate (e.g. is the integrated circuit within a two-dimensional region or outside of a two-dimensional region on the receptor substrate) or the rotational orientation of the integrated circuit on a receptor site on the substrate (e.g. is a particular connection pad 214 shown in FIG. 6 in the upper left corner or the upper right corner or the lower right corner or the lower left corner of the opening on the receptor substrate relative to the position of interconnect lines on the receptor substrate).

In one embodiment of the present invention, the translational position of the integrated circuit is not detected but the rotational orientation is detected. In alternative embodiments, however, both may be detected or merely the translational location may be detected as described below. The position detector 208 receives signals from the pad or pads 207 and these signals are decoded to provide a position signal which may then be provided to the drivers 200, 201, 202, and 203 through the control signal logic 209. Alternatively, the position detector logic may provide a signal directly to the microcontroller 191 which can then provide signals to a control bus 204 to specify the desired functionality based on the position to each of the drivers 200, 201, 202, and 203.

In one particular embodiment (e.g. see FIG. 12) the control signal logic 209 provides the signals specifying the position directly to the drivers 200, 201, 202, and 203. These drivers, after the position has been determined by the position detector logic 208, then provide appropriate control signals so that the configurable pads, such as pads 196, 197, 198, and 199 can be appropriately configured for the detected position. For example, in one embodiment, driver 200 may configure pad 196 as an input pad and driver 202 may configure pad 198 as an output pad allowing data to be, for example, shifted into pad 196 through driver 200 and then to the data bus 205 and then to the driver 202 for outputting of the data through the pad 198. In this case, this would provide for the functionality in which the pixel data is shifted from left to right from display driver to display driver. At the same time the control signals to drivers 201 and 203 would cause the pads 197 and 199 to be configured to be no-operation pads. The signals coming into pad 196 would be supplied by the driver 200 directly to pads 192 (for data intended for those pads) or to the data bus 205 which is used to distribute the data to the other drivers. While a parallel data bus 205 is shown in FIG. 12, it will be appreciated that a serial data bus may also be utilized as an alternative embodiment.

The microcontroller 191 may optionally be coupled to the data bus to receive data and to store it internally within the microcontroller (e.g. within a register in the microcontroller) which then can be used to put the data back on the bus and control the control bus 204 to cause another driver to receive its data under control of the microcontroller 191.

It will be appreciated that the integrated circuit 190, when fabricated in a block of a semiconductor substrate which is then separated from the substrate and deposited through a fluidic self-assembly process onto a receptor substrate, is a case of a rotationally symmetric microcontroller or microprocessor. That is, the integrated circuit 190 includes a microcontroller or microprocessor in an integrated circuit which is externally functionally symmetric. The microcontroller or microprocessor may include many of the conventional components of a microcontroller or a microprocessor such as instruction decoders, instruction registers, data registers, ALU (arithmetic logic units), etc. Further, the functionality of this integrated circuit may be determined by the position detector logic 208 such that in one embodiment the integrated circuit provides one functionality in one position and another functionality in another position. Further, in yet another embodiment, the configurable pads may be configured to provide different signals or functions depending upon the position of the integrated circuit relative to the receptor substrate.

Figure 13:
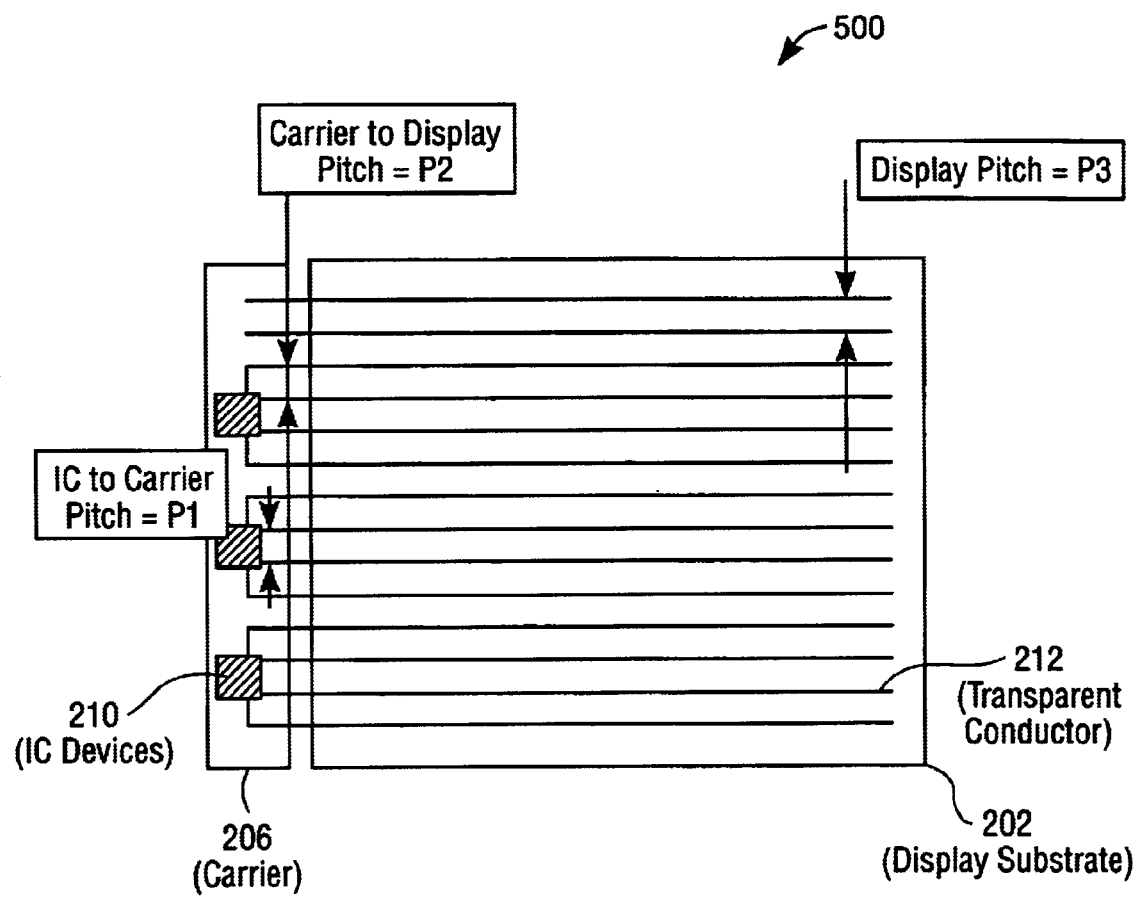
FIG. 13 illustrates an exemplary advantage of some of the exemplary embodiments made according to the present invention in which the pitch of IC chip to the carrier is similar to the pitch of the display.

FIG. 13 illustrates an exemplary display 500 made according to the present invention. The display 500 includes the display substrate 202 having an array of transparent conductors 212. The display 500 has a pitch P3, which, in this example, ranges from 200 μm to 250 μm. The pitch of the display however, depends on the desirable resolution of the display. The higher the resolution of the display 500, the smaller the pitch P3 is. The carrier 206 is having a plurality of IC devices 210 embedded therein is coupled to the display according to the embodiments discussed above.

In this example, the IC devices 210 are evenly spaced apart along the carrier 400. Interconnections are made from the IC devices 210 to the array of transparent conductors 212. The interconnections are established from at least two sides of the IC devices 210. Interconnections from at least two sides of the IC devices enables the carrier 500 to have a pitch P2 that is substantially similar to the pitch P3 of the display 500. For example, when the pitch P3 of the display 500 is 200 μm, the carrier 400 has a pitch P2 that is nearly equal to 200 μm. The IC devices 210 have a pitch P1 that is substantially similar to the pitch P2. The pitch P1 is also substantially similar to the pitch P3. The pitch P1 may be 150 μm or 250 μm and still would be considered substantially similar to the pitch P3 of the display.

FIG. 14 illustrates another exemplary embodiment of the present invention. This figure illustrates a display 601. The display 300 is similar to the display 300 shown in FIG. 7 in that interconnections from the IC devices 210 are made from at least two sides of each of the IC devices 210. The display 601 differs from the display 300 in that the IC devices 210 are integrated directly into the display substrates. In particular, the display 601 comprises of top substrate 602 and a bottom substrate 604. These substrates can be made out of a transparent material suitable for making a display. In one example, these substrates are flexible. The top substrate 602 may include a column array of transparent conductors 606 and the bottom substrate 604 may include a row array of transparent conductors 608. The top substrate 602 further includes a plurality of IC devices 210 integrated into the top substrate 602 as opposed to being placed into a carrier like the carrier 400 discussed above. The bottom substrate 604 also includes a plurality of IC devices 210 integrated into the bottom substrate 604. All other aspects of the display 601 are similar to the display 300 discussed above.

FIGS. 15A and 15B illustrate an exemplary display 601 made according to the present invention. The display 601 of these figures is similar to the display 601 of FIG. 14 except that a double-layer structure conductor facilitates the interconnection of the IC devices 210 to the array of the transparent conductors on the display substrates. Similar to FIG. 14, the display 601 has a plurality of IC devices 210 that are integrated into the top or the bottom substrate of the display 601. A small area along an edge of the substrate 610 is reserved for the IC devices to be integrated into the display 601. This area is referred to as an integration area 622. The substrate 610 can be the top substrate 602 or the bottom substrate 604 shown in FIG. 14. In another embodiment, the IC devices 210 are embedded into a carrier as shown in FIG. 7 and that a double-layer structure conductor is also used in this embodiment to facilitate the interconnection of the IC devices 210 to the array of transparent conductors. In the embodiment where the IC devices 210 are embedded into a carrier which is later coupled to a display substrate as discussed above, the substrate 610 of FIGS. 15A and 15B is the carrier itself.

FIG. 15A shows in a cross-sectional view of the integration area 622 of the substrate 610 having the IC devices 210 deposited therein. In this embodiment, the IC devices 210 drive the display 601 with a double-layer structure conductor which includes a first set of conductors 612 and a second set of conductors 614. The first set of conductors 612 is deposited over the integration area 622 of the substrate 610. In one example, the first set of conductors 612 is not deposited over the IC devices 210. The first set of conductors 612 can be those conductors that interconnect all of the IC devices in the substrate 610 to common electrical inputs to drive the display 601 such as grounds, signals, data, clock, or power. An insulation layer 620 is deposited over the entire integration area 622 of the substrate 610 which includes the IC devices 210 and the first set of conductors 612. The insulation layer 620 comprises a plurality of contact vias 616 formed in the insulation layer 620. The contact vias 616 enable the IC devices 210 to make interconnections to the first set of conductors 612. The first set of conductors 612 in turn interconnect the IC devices 210 to the grounds, signals, data, clock, or power typically needed to drive the display 601.

The second set of conductors 614 of FIG. 15A having a pattern that matches the array of the transparent conductors of the substrate 610 is deposited over the insulation layer 620. The second set of conductors 614 interconnects the IC devices 210 to the array of transparent conductors to drive the pixel images on the display 601. The second set of conductors 614 also interconnects the first set of conductors 612 to the IC devices. The IC devices thus drive the display 601 through the use of a double-layer structure conductor, the first set of conductors 612 and the second set of conductor 614.

FIG. 15B illustrates another exemplary embodiment the display 601. FIG. 15B shows in a cross-sectional view of the integration area 622 of the substrate 610 having the IC devices 210 deposited therein. The IC devices 210 drive the display 601 with a double-layer structure conductor which includes a first set of conductors 612 and a second set of conductors 614.

An insulation layer 620 is deposited over the integration area 622 of the substrate 610 and over the IC devices 210. The insulation layer 620 comprises a first plurality of contact vias 616 formed in the insulation layer 620. The contact vias 616 enable necessary electrical interconnection from the IC devices 210 to other parts of the display (e.g., the transparent conductors).

A second set of conductors 614 having a pattern matching the array of transparent conductors of the display 601 are deposited over the insulation layer. The second set of conductors 614 controls the interconnection from the IC devices 210 to the array of transparent conductors to drive the pixel images on the display. The IC devices 210 interconnect to the second set of conductors 614 through the contact vias 614. The IC devices 210 are thus able to drive the display through these vias.

A first set of conductors 612 is deposited on the bottom side of the integration area 622 of the substrate 610. The first set of conductors 612 can be those conductors that interconnect all of the IC devices in the substrate 610 to common electrical inputs to drive the display 601 such as grounds, signals, data, clock, or power. To enable interconnections from the IC devices 210 to the first set of conductors 612, vias are also used. A second plurality of vias 618 formed in the integration area 622 of the substrate 610 enables the IC devices 210 to interconnect the first set of conductors 614.

The IC devices thus drive the display 601 through the use of a double-layer structure, the first set of conductors 612 and the second set of conductor 614. These double metal approaches discussed in FIGS. 15A and 15B can also be applied to the cases where IC devices are in a carrier, the carrier being interconnected to the display substrate (all Figures prior to FIG. 14).

Figure 16:
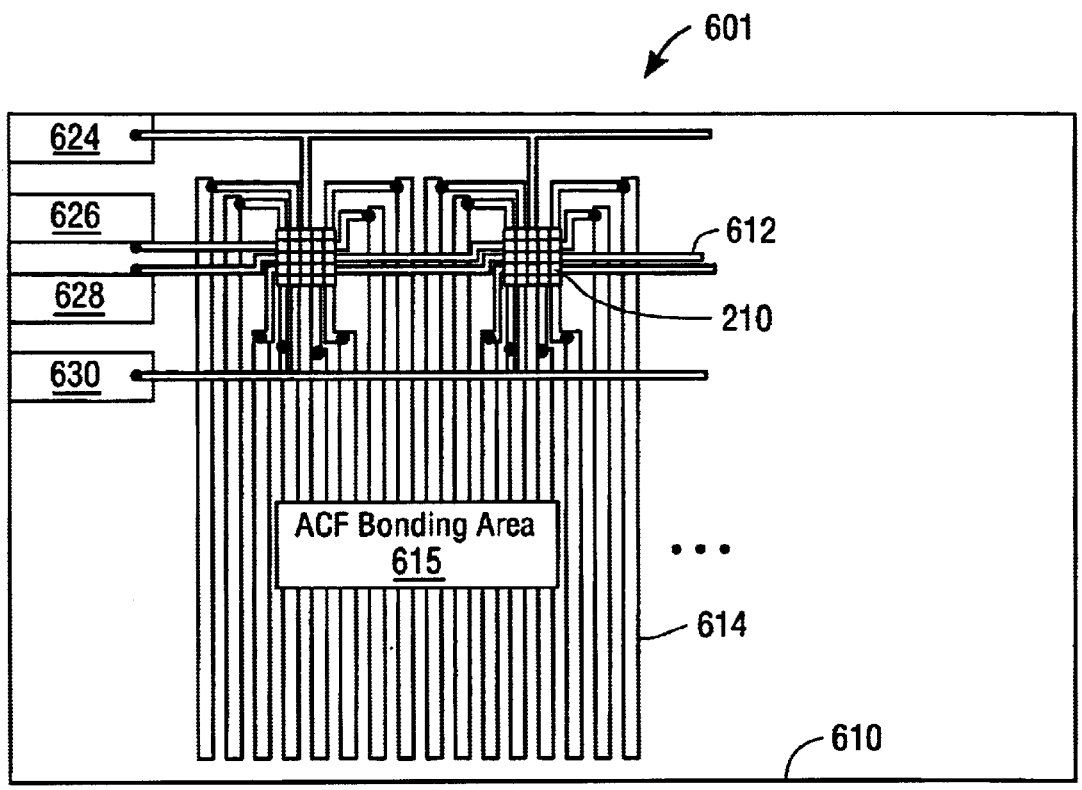
FIG. 16 illustrates a top view of another exemplary embodiment of a structure of double conductive layers that can be used to drive a display made according to some aspects of the present invention.
Figure 17:
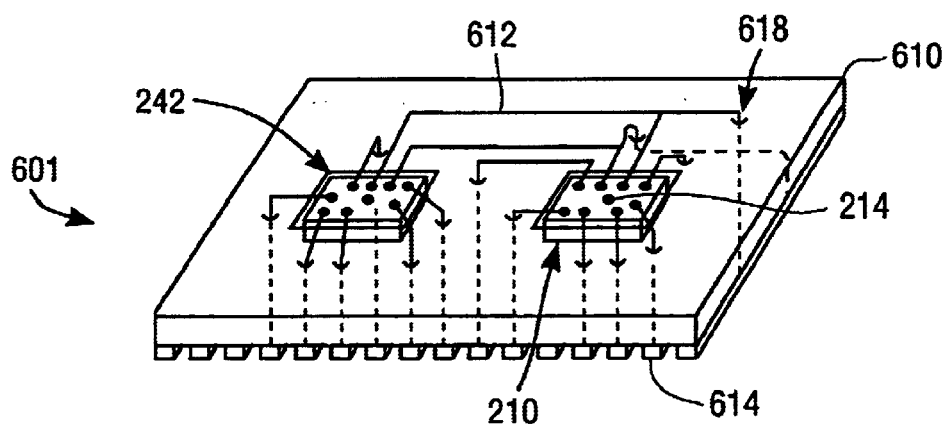
FIG. 17 illustrates a three-dimensional view of the embodiment shown in FIG. 16.

FIGS. 16 to 20A, B illustrate further exemplary configurations of the double-layer structure conductor discussed in FIG. 15A and 15B. FIG. 16 illustrates a topical view an exemplary embodiment of a display 601 having the IC devices 210 embedded in a substrate 610. The IC devices 210 of this embodiment also drive the display 601 with a double-layer structure conductor. FIG. 17 illustrates a three-dimensional view of the exemplary display 601 shown in FIG. 16.

In FIGS. 16 and 17, a substrate 610 is shown to include a plurality of receptor sites 242 each having an IC device 210 deposited therein. In embodiments where the substrate 610 is a carrier having the IC devices 210 embedded therein, the substrate 610 is similar to the carriers described above (e.g., carrier 206, carrier 208, and carrier 400) described above. The IC device 210 includes a plurality of connection pads (illustrated by the black dots) on its surface. The connection pads interconnect the active circuits (not shown) within the IC devices 210 to other necessary electrical components to drive the display 601.

A first set of conductors 612 is deposited over the top surface of the substrate 610 FIGS. 16 to 17. The first set of conductors 612 is coupled to the connection pads on the IC devices 210. The substrate 610 of further includes a plurality of vias 618 formed into the substrate 610. Each of the first set of conductor 612 goes through a vias 618 to reach the back side of the substrate 610 which further has a second set of conductors 614 deposited thereon. The first set of conductors 612 then interconnect the second set of conductors 614. The second set of conductors 614 has a pattern that matches the array of transparent conductor on the display 601. When all of the interconnections are complete, the IC devices drive the display through these first sets of conductors 612 and the second set of conductors 614. For example, the first set of conductors 612 may interconnect with electrical inputs to drive the display 601 such as grounds 624, data signals 626, clock 628, or power 630. And, the second set of conductors 614 may interconnect with the transparent electrodes (not shown) on the display to drive the pixel images on the display 601.

The substrate 610 may be attached to the display substrate using the ACF tape according to the embodiments described above. In the example in FIGS. 16 to 17, the ACF tape is deposited over the set of second conductors 614 in an ACF bonding area 615. The ACF tape then affixes the substrate 610 to the display substrate (not shown).

Figure 18A:
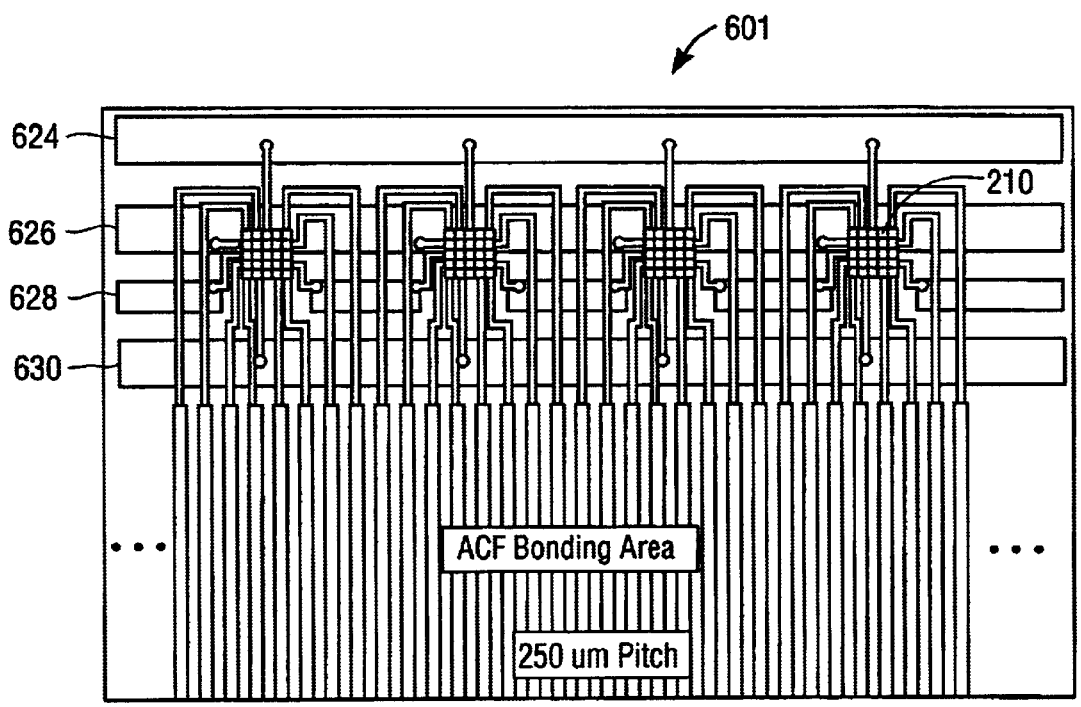
FIG. 18A illustrates a top view and FIG. 18B illustrate a cross-sectional view of yet another exemplary embodiment of a structure of double conductive layers that can be used to drive a display made according to some aspects of the present invention.
Figure 18B:
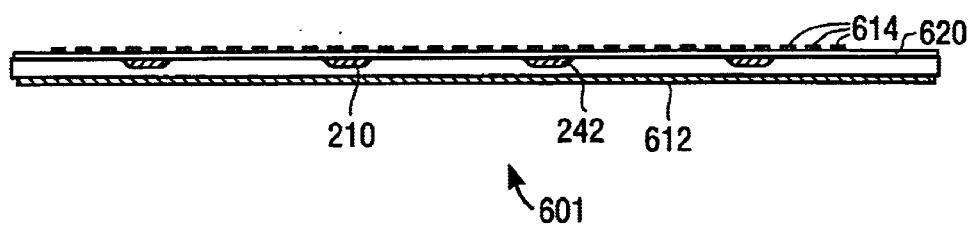
Figure 19A:
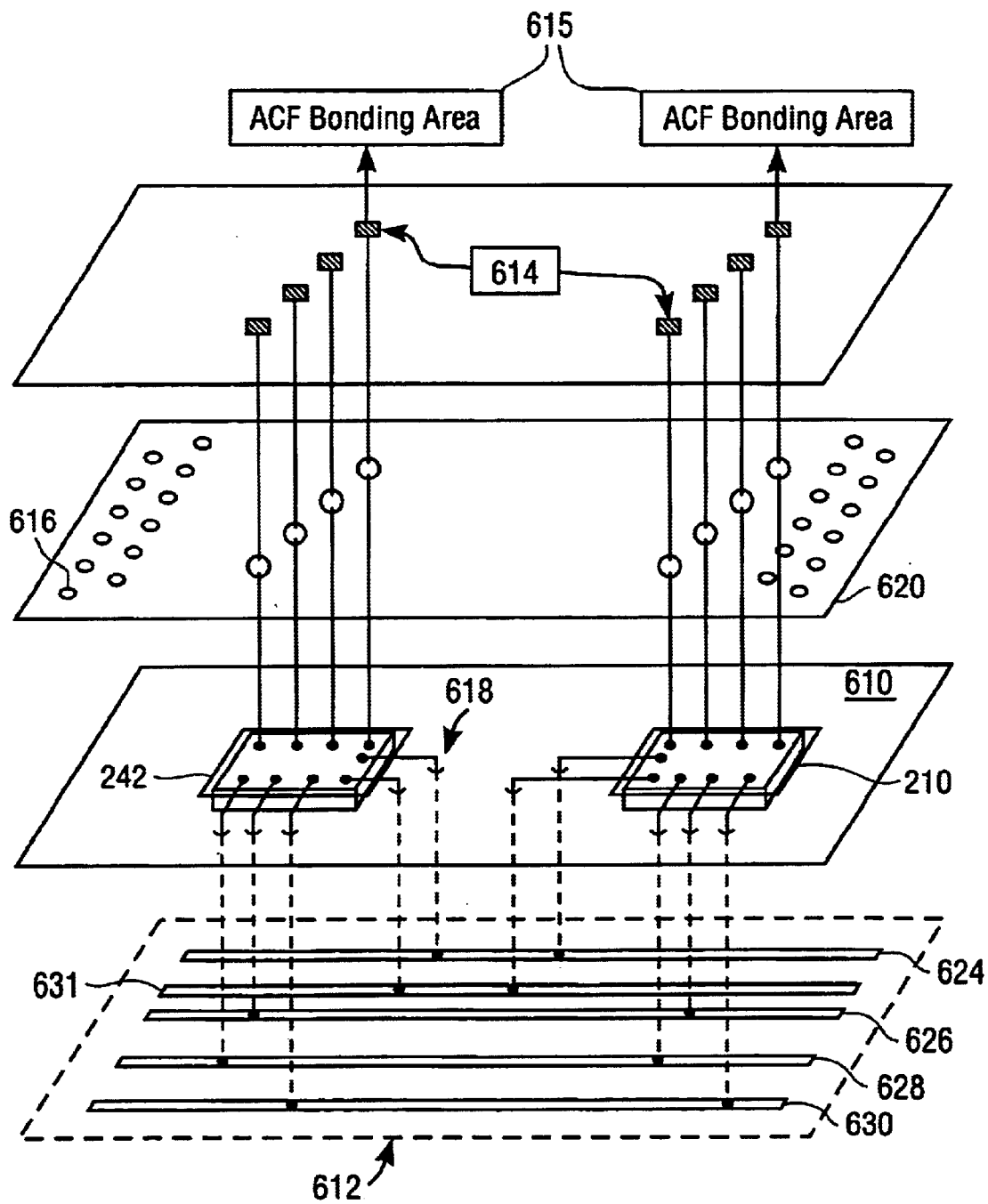
FIG. 19A illustrates an exploded view of the embodiment shown in FIGS. 18A and 18B.

FIGS. 18A and 18B illustrate a top view another exemplary embodiment of a display 601. The display 601 may have the IC devices 210 embedded in a carrier that is coupled to a display panel. Alternatively the display 601 may have the IC devices 210 integrated directly into the display panel. In both alternatives, the IC devices 210 drive the display 601 with a double-layer structure connector. FIG. 19A illustrates an exploded three-dimensional view of the exemplary embodiment shown in FIG. 18. A substrate 610 is shown to include a plurality of receptor sites 242 each having an IC device 210 deposited there in. The display 601 includes a substrate 610. In the embodiment where the IC devices 210 are integrated into the display panel, the substrate 610 has an area which extends from the display panel, where the IC devices 210 can be integrated. And where the IC devices 210 are embedded into a carrier, the substrate 610 is the carrier which is coupled to the display panel. The substrate 610 is similar to the carriers described above (e.g., carrier 206, carrier 208, and carrier 400) described above. The IC device 210 includes a plurality of connection pads (illustrated by the black dots in FIG. 19A) on its surface. The connection pads interconnect the active circuits (not shown) within the IC devices 210 to other necessary electrical components to drive the display 601.

Continuing with FIGS. 18A, 18B, and 19A, a first set of conductors 612 is deposited on the back surface of the substrate 610. The first set of conductors 612 interconnect the connection pads on the IC devices 210 through a first plurality of vias 618 formed into the substrate 610. In one example, each of the first set of conductors 612 goes through a vias 618 from the back surface of the substrate 610 to reach the connection pads on the IC devices 210. It is also through the vias 618 that the first set of conductors 612 can also reach a second set of conductors 614 which is deposited over an insulation layer 620.

The insulation layer 620 is deposited over the top surface of the substrate 610 having the IC devices 210 deposited therein. The insulation layer 620 includes a second plurality of vias 616 (FIG. 19A) formed through the insulation layer 620. In one example, the second plurality of vias 616 are formed over the area that electrical interconnections are desired.

A second set of conductors 614 is deposited over the insulation layer 620 and interconnecting the IC devices 210 through the first plurality of vias 618 and the second plurality of vias 616. In this example, the second set of conductors 614 has a pattern that matches the array of transparent conductor (not shown) on the display 601. The second set of conductors 614 then interconnect the IC devices 210 to the transparent electrodes on the display 601 substrate to drive the display 601.

The first set of conductors 612 also interconnect the second set of conductors 614 as illustrate in FIG. 18A. When all of the interconnections are complete, the IC devices 210 drive the display through the first set of conductors 612 and the second set of conductors 614. For example, the first set of conductors 612 may interconnect with electrical inputs to drive the display 601 such as grounds 624, data signals 626, clock 628, or power 630. The first set of conductors 612 may also interconnect one IC device 210 to another IC device 210 within the substrate 610. For example, the conductor 631 interconnects two IC devices 210 to each other as shown in FIG. 19A. The first set of conductors 612 interconnect with the second set of conductors 614 to deliver the electrical inputs (e.g., grounds 624, data signals 626, clock 628, or power 630) to the IC devices 210 which in turn drive the display 601.

Figure 19B:
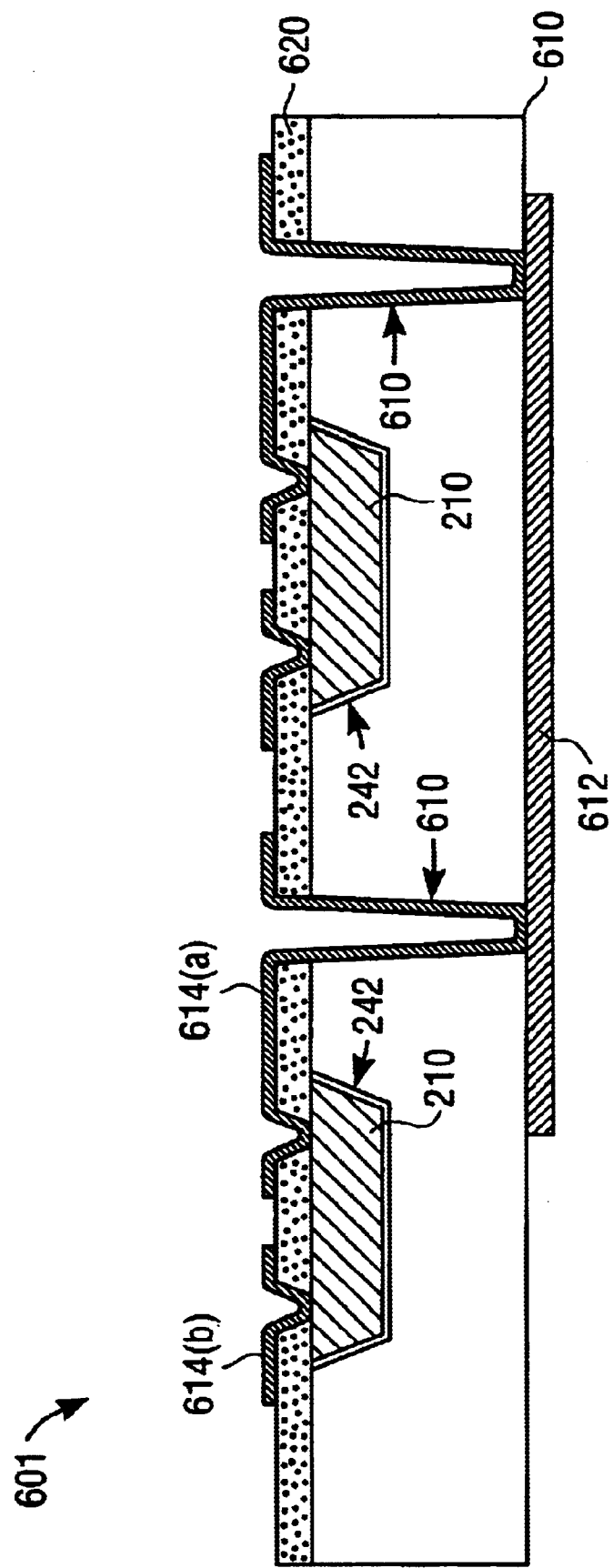
FIG. 19B illustrates a cross-sectional view of double-layer structure conductors.

FIG. 19B illustrates another embodiment. In some cases, the insulation layer 620 may need to be deposited directly above the substrate 610 to secure the IC devices 210 in the Receptor sites 242 in the substrate 610. In this embodiment, the first set of conductors 612 deposited on the bottom of the substrate 610 does not contact the IC devices 210 directly. Instead, the first set of conductors 612 interconnect the IC devices 210 through the first set of plurality of vias 618 formed through the substrate 610. The first set of conductors 612 may interconnect with conducting pads 614(*a*) which in turn interconnects the first set of conductors 612 to the IC devices 210 as shown in FIG. 19B. The IC devices 210 may interconnect the array of transparent conductors on the display panel (not shown) through the second set of conductors 614(*b*). The second set of conductors 614(*b*) may have a pattern that matches the pattern of the array of transparent conductors.

In the embodiments where the substrate 610 is a carrier, the substrate 610 in the embodiments described above may be attached to the display panel using the ACF tape described above. In this example, an ACF tape is deposited over the set of second conductors 614 over the ACF bonding area 615. The ACF tape then affix the substrate 610 to the display 601 according conventional methods.

Figure 20A:
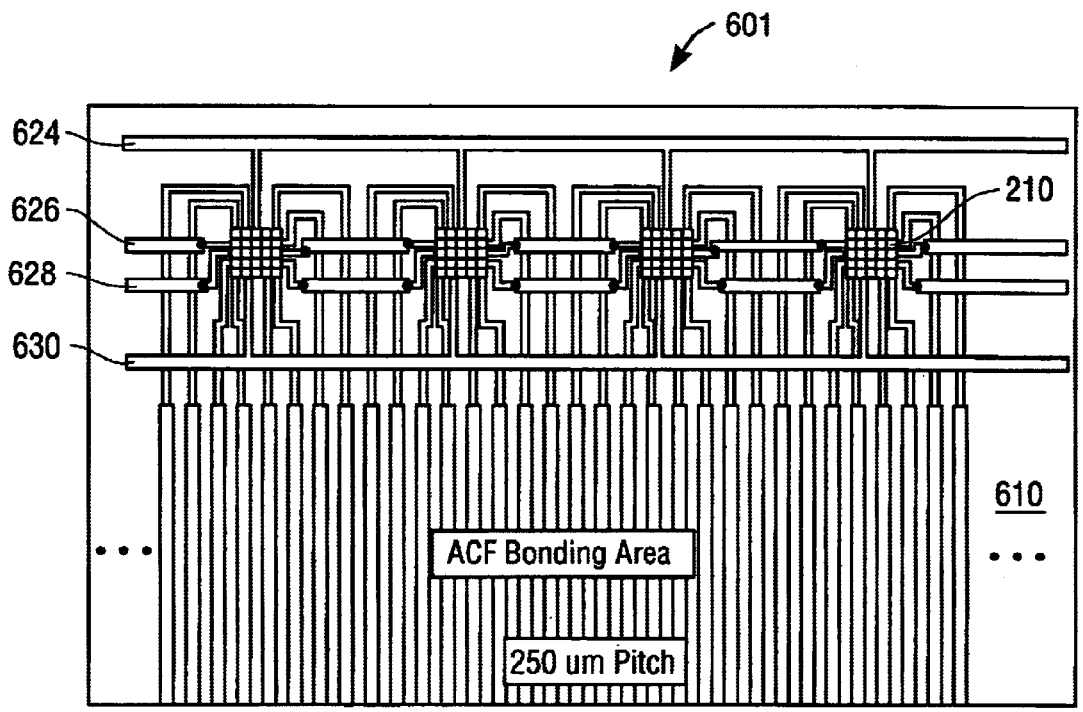
FIGS. 20A illustrates a top view and FIG. 20B illustrate a cross-sectional view of yet another exemplary embodiment of a structure of double conductive layers that can be used to drive a display made according to some aspects of the present invention.
Figure 20B:
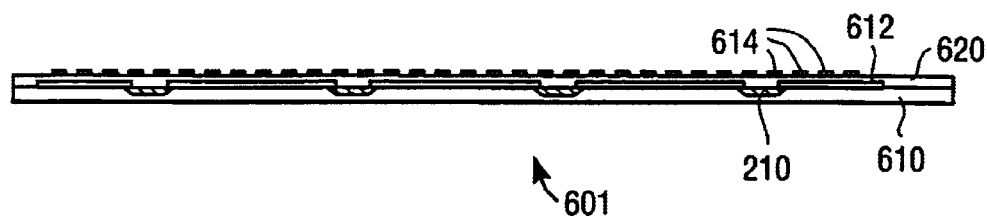

FIGS. 20A and 20B illustrate another exemplary embodiment of a display 601 having the IC devices embedded in a substrate 610 (or directly incorporated in the display substrate) wherein the IC devices 210 drive the display 601 with a double-layer structure conductor. FIG. 20A is a topical surface illustration and FIG. 20B is a cross-sectional illustration of FIG. 20A for clarity sake. In this embodiment, the substrate 610 (or the display substrate where the IC devices are directly incorporated) is a carrier similar to the carriers 226, 228, and 400 described above wherein the substrate 610 is affixed to a display substrate (not shown). The substrate 610 has a plurality of IC devices 210 deposited therein. This embodiment is similar to the embodiment described in FIGS. 18A, 18B and 19A, and 19B above with one exception that a first set of conductors is deposited on the top surface of a substrate 610 instead of on the bottom of the substrate 610.

A first set of conductors 612 is deposited on the substrate 610 as shown in FIG. 20B. In one example, the first set of conductors 612 is not deposited over the IC devices 210. The first set of conductors 612 may contact the IC devices 210 directly through a plurality of contacting pads (not shown here) on the surface of the IC devices 210. The first set of conductors 612 may interconnect the IC devices to electrical inputs such as ground 624, signal data 626, clock 628 or power 630 which drive the display.

An insulation layer 620 is then deposited over the first set of conductors 612 and the substrate 610 which has the IC devices 210 deposited therein. The insulation layer 620 comprises a plurality of vias (not shown) formed in the insulation layer 620. The contact vias enable the first set of conductors 612 to interconnect a second set of conductors 614 which is deposited over the insulation layer 620.

The second set of conductors 614 has a pattern that matches the array of the transparent conductors of the display substrate. The second set of conductors 614 interconnects the IC devices (through the vias) to the array of transparent conductors to drive the pixel images on the display. The IC devices thus drive the display 601 through the use of a double-layer structure, the first set of conductors 612 and the second set of conductor 614.

FIGS. 21A, 21B, and 21C, illustrate yet another embodiment of the present invention. In this embodiment, the row and column drivers are incorporated into one substrate of the display. Similar to discussed above, a display 2000 may comprise of a bottom substrate 2100, which further comprises an array of columns of transparent electrodes 2102 and a top substrate 2200, which further comprises an array of rows of transparent electrodes 2202.

FIG. 21A shows that the bottom substrate 2100 has a plurality of column drivers 2104 (e.g., IC devices 210) interconnect (not shown) to the array of columns of transparent electrodes 2102 to drive this portion of the display 2000. The bottom substrate 2100 also has a plurality of row drivers 2105 which are dedicated to driver the array of rows of transparent electrodes 2202 of the display 2000. This is accomplished by the bottom substrate 2100 having a plurality of cross-over connectors 2106 deposited on a contact area 2101. The contact area 2101 can be an extension from the bottom substrate 2100. Alternatively, the contact area 2101 can be a different piece of substrate that is coupled to or deposited onto the bottom substrate 2100. The cross-over connectors 2106 are interconnected to the plurality of row drivers 2105. The cross-over connectors 2106 have the pattern of the array of the rows of transparent electrodes 2202 and are allowed to contact the array of the rows of transparent electrodes 2202. One way to allow for this contact is using the ACF tape discussed above. Other ways of interconnecting includes dots of conductive epoxy or low-temperature solder or other standard interconnect methods. As shown in FIG. 21B, the ACF tape 2204 is deposited over a section of the top substrate 2200. When the top substrate 2200 is adhered to the bottom substrate 2100, the ACF tape 2204 establishes both electrical and mechanical contacts of the array of the rows of transparent electrodes 2202 to the cross-over connectors 2106.

FIG. 21C illustrates a cross-sectional view of the display 2000 having the top substrate 2200 adhered to the bottom substrate 2100. The ACF tape 2204 facilitates the row drivers incorporated in the bottom substrate 2100 to drive the rows of transparent electrodes 2202 in the top substrate 2200. A conventional sealant 2206 such as epoxy can be used according to well known methods to further hold the top substrate 2200 and the bottom substrate 2100 together.

In yet another embodiment, the drivers are incorporated into one carrier which can be attached to either a top substrate or a bottom substrate of a display. All aspects of this embodiment are similar to the display 2000 described in FIGS. 21A, 21B and 21C. An exemplary configuration of a display having the row and column drivers incorporated into a carrier which is attached to the bottom substrate is illustrated in FIG. 22A and 22B. A display 2300 is shown to comprise a bottom substrate 2301, a top substrate 2303 and carrier 2310. The top substrate 2303 includes an array of rows of transparent conductors 2302. The bottom substrate 2301 includes an array of columns of transparent conductors 2302. The carrier 2310 includes row drivers 2306 and column drivers 2305 incorporated therein. The row and column drivers can be Nano-blocks or microstructures having integrated circuits to drive the display 2300. The carrier 2310 can be divided to two carrier, one attached to the long edge and one attached to the short edge of the bottom substrate 2301. Alternatively, and as shown in FIG. 22A, the carrier 2310 is one piece that has an "L" shape. The carrier 2310 can be attached to the bottom substrate 2301 a shown in FIG. 22A. Alternatively, the carrier 2310 can be attached to the top substrate 2300. In FIG. 22A, the carrier is attached to the bottom substrate 2301. There, the bottom substrate 2301 also includes a contact area 2308 which is similar to the contact area 2101 of FIG. 21A above. The top substrate 2303 includes an ACF tape 2304. When the top substrate 2300 is adhered to the bottom substrate 2301, the ACF tape 2304 is disposed over the contact area 2308. The row drivers 2306, which interconnects with the contact are 2308, will conduct through the ACT tape 2304 to interconnect the row drivers 2306 to the array of rows of transparent conductor 2302.

We claim:

1. A display device comprising:
    a first array of transparent conductors deposited on a display panel, the first array of transparent conductors having a first pitch defined by a first distance between first adjacent transparent conductors;
    a carrier having a plurality of blocks each having an integrated circuit (IC) device disposed therein is coupled to the display panel, the carrier having a plurality of receptor sites configured to receive the plurality of functional blocks; and
    a second array of conductors disposed on the plurality of IC devices, the second array of conductors having a second pitch defined by a second distance between second adjacent conductors wherein the first pitch and the second pitch are substantially similar and wherein the first array of transparent conductors interconnect the second array of conductors.

2. The display device as in claim 1 wherein the second array of conductors substantially surrounds a perimeter of each of the plurality of the blocks.

3. The display device as in claim 1 wherein the second array of conductors interconnects the first array of transparent conductors along at least one edge of the carrier.

4. The display device as in claim 1 wherein the display device has a first length, the carrier has a second length wherein the second length is substantially similar to the first length.

5. The display device as in claim 1 wherein the display is flexible.

6. The display device as in claim 1 wherein the plurality of blocks are NanoBlocks.

7. The A display device as in claim 1 wherein the carrier is flexible.

8. A method of making a display device comprising:
    coupling a carrier having a plurality of blocks each having an integrated circuit (IC) device disposed therein to a display panel, the display panel comprising a first array of transparent conductors having a first pitch defined by a first distance between first adjacent transparent conductors, the plurality of IC devices comprising a second array of conductors disposed thereon, the second array of conductors having a second pitch defined by a second distance between second adjacent conductors, wherein the first pitch and the second pitch are substantially similar; and
    interconnecting the first array of transparent conductors to the second array of conductors.

9. The method of making a display device as in claim 8 wherein the second array of conductors substantially surrounds a perimeter of each of the plurality of the blocks.

10. The method of making a display device as in claim 8 wherein the second array of conductors interconnect the first array of transparent conductors along at least one edge of the carrier.

* * * * *

UNITED STATES PATENT AND TRADEMARK OFFICE
CERTIFICATE OF CORRECTION

PATENT NO. : 6,693,384 B1
DATED : February 17, 2004
INVENTOR(S) : Frederic J. Vicentini et al.

It is certified that error appears in the above-identified patent and that said Letters Patent is hereby corrected as shown below:

<u>Column 1,</u>
Line 3, please insert -- This invention was made with government support under Contract No. DAAD16-00-C-9234. The government has certain rights to this invention. --.

Signed and Sealed this

Twentieth Day of September, 2005

JON W. DUDAS
*Director of the United States Patent and Trademark Office*